US012057478B2

(12) United States Patent
Chen et al.

(10) Patent No.: US 12,057,478 B2
(45) Date of Patent: *Aug. 6, 2024

(54) GATE STRUCTURES FOR SEMICONDUCTOR DEVICES

(71) Applicant: Taiwan Semiconductor Manufacturing Co., Ltd., Hsinchu (TW)

(72) Inventors: Yen-Yu Chen, Taichung (TW); Chung-Liang Cheng, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/837,859

(22) Filed: Jun. 10, 2022

(65) Prior Publication Data

US 2022/0320284 A1 Oct. 6, 2022

Related U.S. Application Data

(63) Continuation of application No. 16/835,916, filed on Mar. 31, 2020, now Pat. No. 11,374,090.

(Continued)

(51) Int. Cl.
*H01L 29/06* (2006.01)
*H01L 21/8234* (2006.01)
(Continued)

(52) U.S. Cl.
CPC .. *H01L 29/0673* (2013.01); *H01L 21/823412* (2013.01); *H01L 21/823431* (2013.01);
(Continued)

(58) Field of Classification Search
CPC ............ H01L 29/0673; H01L 29/0847; H01L 29/1037; H01L 29/4966; H01L 29/517;
(Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

CN 102856377 A 1/2013
CN 109285810 A 1/2019
(Continued)

*Primary Examiner* — Christine A Enad
(74) *Attorney, Agent, or Firm* — Sterne, Kessler, Goldstein & Fox P.L.L.C.

(57) ABSTRACT

A semiconductor device with different gate structure configurations and a method of fabricating the same are disclosed. The semiconductor device includes first and second pair of source/drain regions disposed on a substrate, first and second nanostructured channel regions, and first and second gate structures with effective work function values different from each other. The first and second gate structures include first and second high-K gate dielectric layers, first and second barrier metal layers with thicknesses different from each, first and second work function metal (WFM) oxide layers with thicknesses substantially equal to each other disposed on the first and second barrier metal layers, respectively, a first dipole layer disposed between the first WFM oxide layer and the first barrier metal layer, and a second dipole layer disposed between the second WFM oxide layer and the second barrier metal layer.

20 Claims, 23 Drawing Sheets

Related U.S. Application Data

(60) Provisional application No. 62/928,557, filed on Oct. 31, 2019.

(51) Int. Cl.
*H01L 27/088* (2006.01)
*H01L 29/08* (2006.01)
*H01L 29/10* (2006.01)
*H01L 29/49* (2006.01)
*H01L 29/51* (2006.01)

(52) U.S. Cl.
CPC ............... *H01L 21/823437* (2013.01); *H01L 21/823462* (2013.01); *H01L 27/0886* (2013.01); *H01L 29/0847* (2013.01); *H01L 29/1037* (2013.01); *H01L 29/4966* (2013.01); *H01L 29/517* (2013.01)

(58) Field of Classification Search
CPC ..... H01L 21/823412; H01L 21/823431; H01L 21/823462; H01L 27/0886
See application file for complete search history.

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,812,449 B2 | 11/2017 | Obradovic et al. | |
| 9,985,023 B1 | 5/2018 | Liu et al. | |
| 9,997,519 B1 | 6/2018 | Bao et al. | |
| 10,825,736 B1 | 11/2020 | Zhang et al. | |
| 2016/0093536 A1* | 3/2016 | Yang | H01L 29/66545 257/392 |
| 2017/0035878 A1 | 2/2017 | Gosselin et al. | |
| 2017/0256544 A1 | 9/2017 | Chai et al. | |
| 2017/0358578 A1 | 12/2017 | Li | |
| 2018/0301383 A1 | 10/2018 | Kim | |
| 2019/0081152 A1 | 3/2019 | Suh et al. | |
| 2019/0131382 A1 | 5/2019 | Lu et al. | |
| 2019/0189767 A1 | 6/2019 | Song et al. | |
| 2019/0198498 A1 | 6/2019 | Park et al. | |
| 2019/0311953 A1 | 10/2019 | Cho et al. | |
| 2019/0371675 A1 | 12/2019 | Tsai et al. | |
| 2020/0035678 A1 | 1/2020 | Lee et al. | |
| 2020/0043808 A1* | 2/2020 | Bao | H01L 21/28088 |
| 2021/0082915 A1* | 3/2021 | Bao | H01L 27/0922 |
| 2021/0134951 A1 | 5/2021 | Chen et al. | |

FOREIGN PATENT DOCUMENTS

| | | |
|---|---|---|
| KR | 20180115416 A | 10/2018 |
| KR | 20190028061 A | 3/2019 |
| KR | 20190076251 A | 7/2019 |
| KR | 20190118269 A | 10/2019 |
| TW | 201917883 A | 5/2019 |
| WO | WO-2014012265 A1 | 2/2014 |

\* cited by examiner

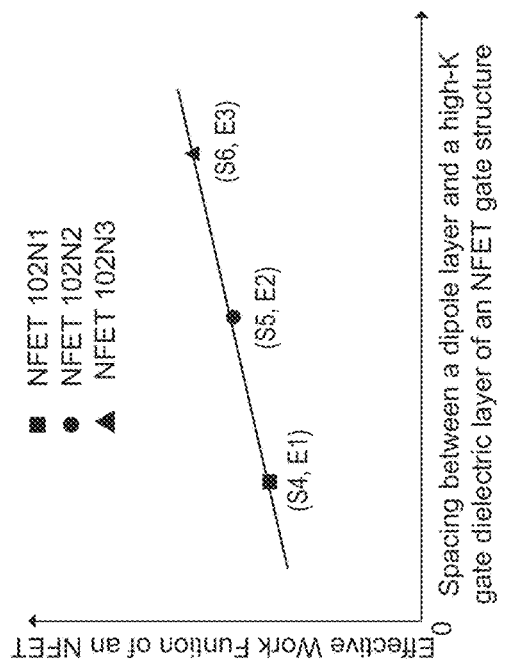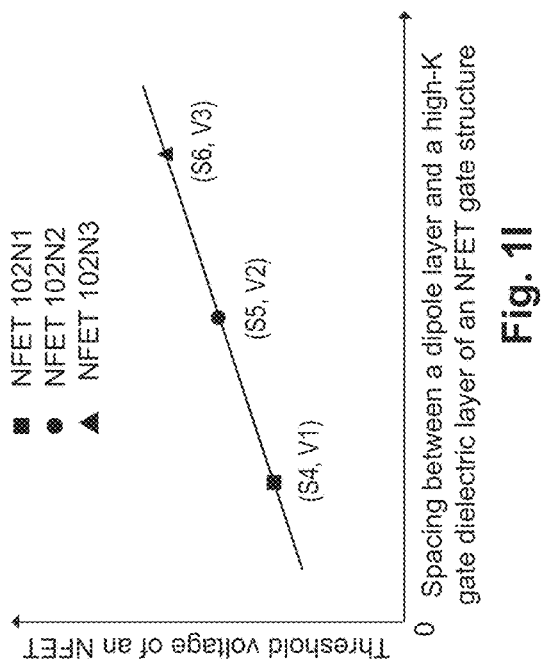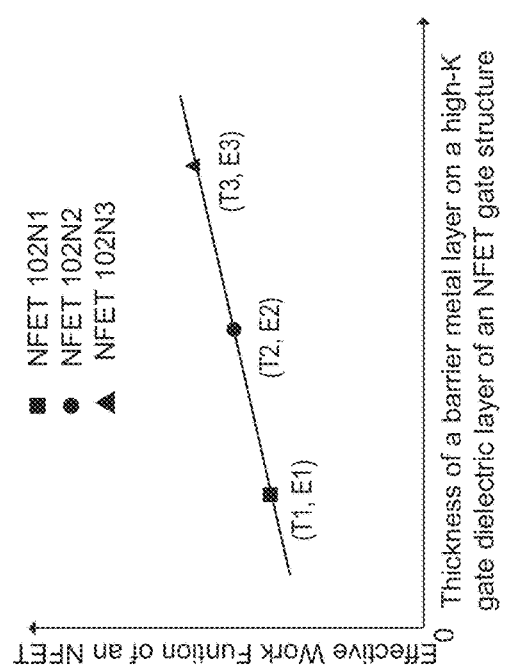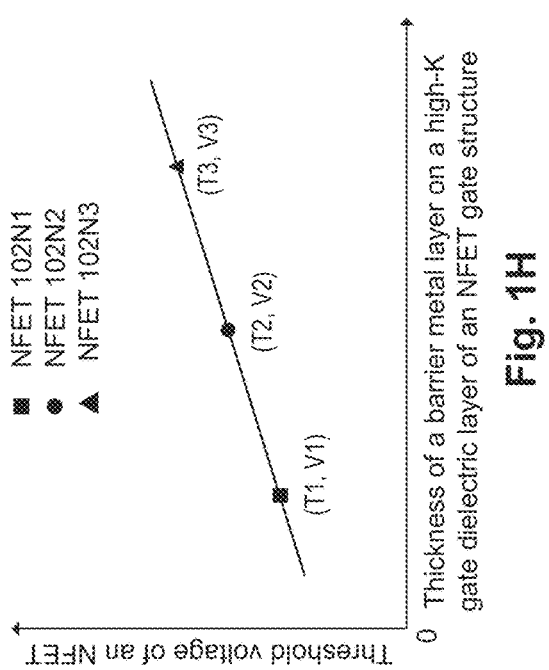
Fig. 1F
Fig. 1G
Fig. 1H
Fig. 1I

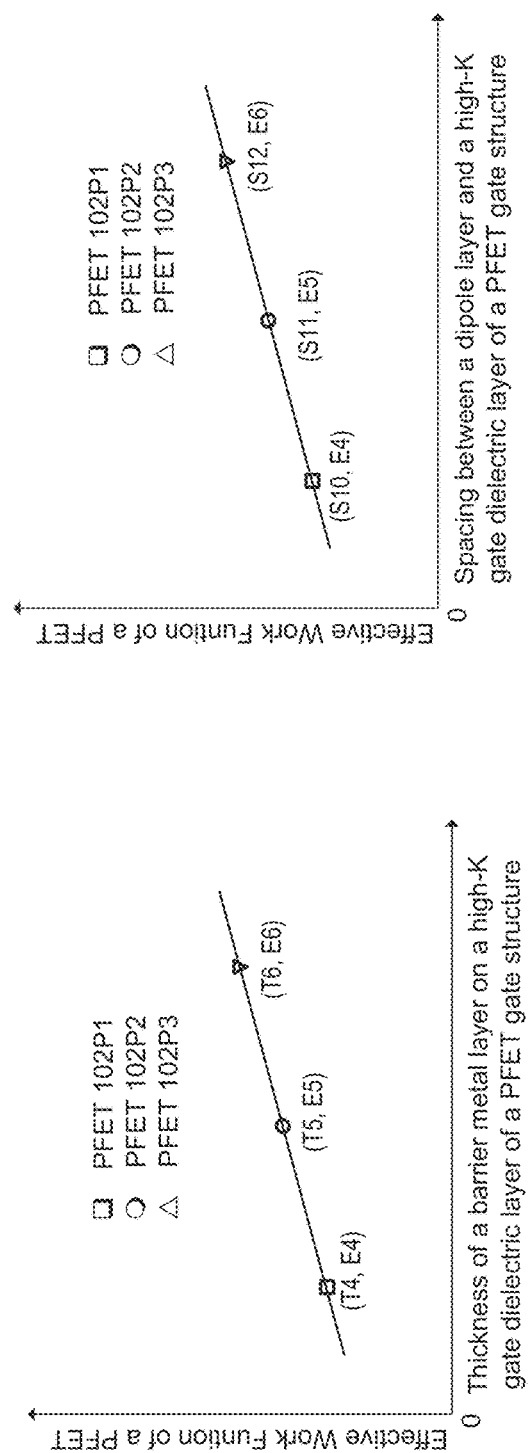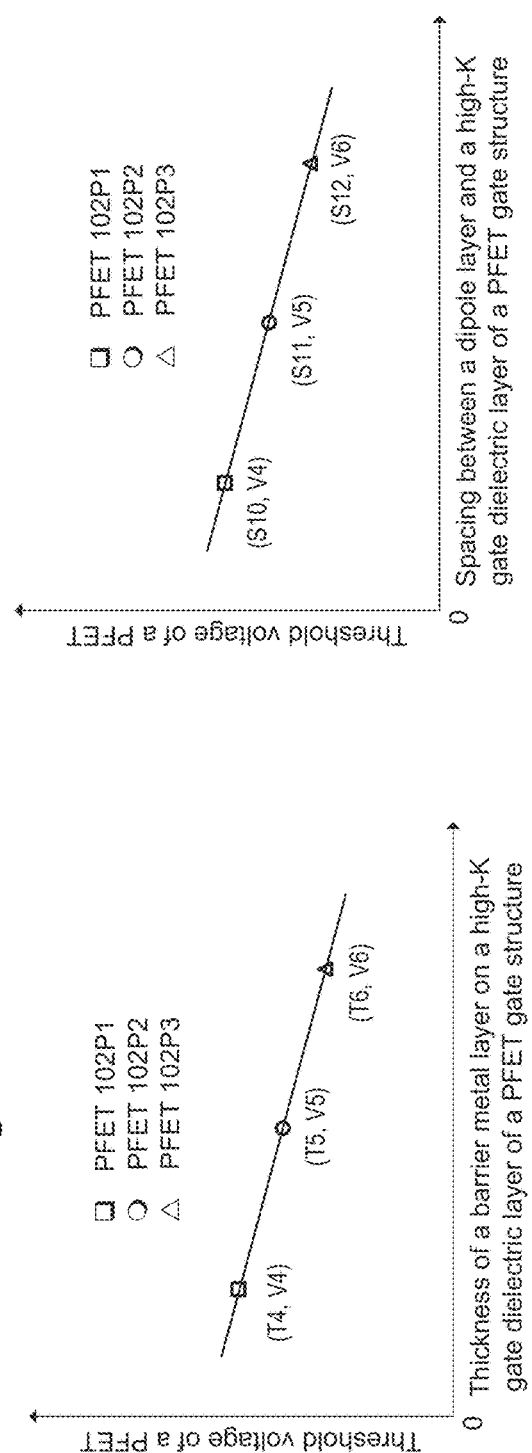

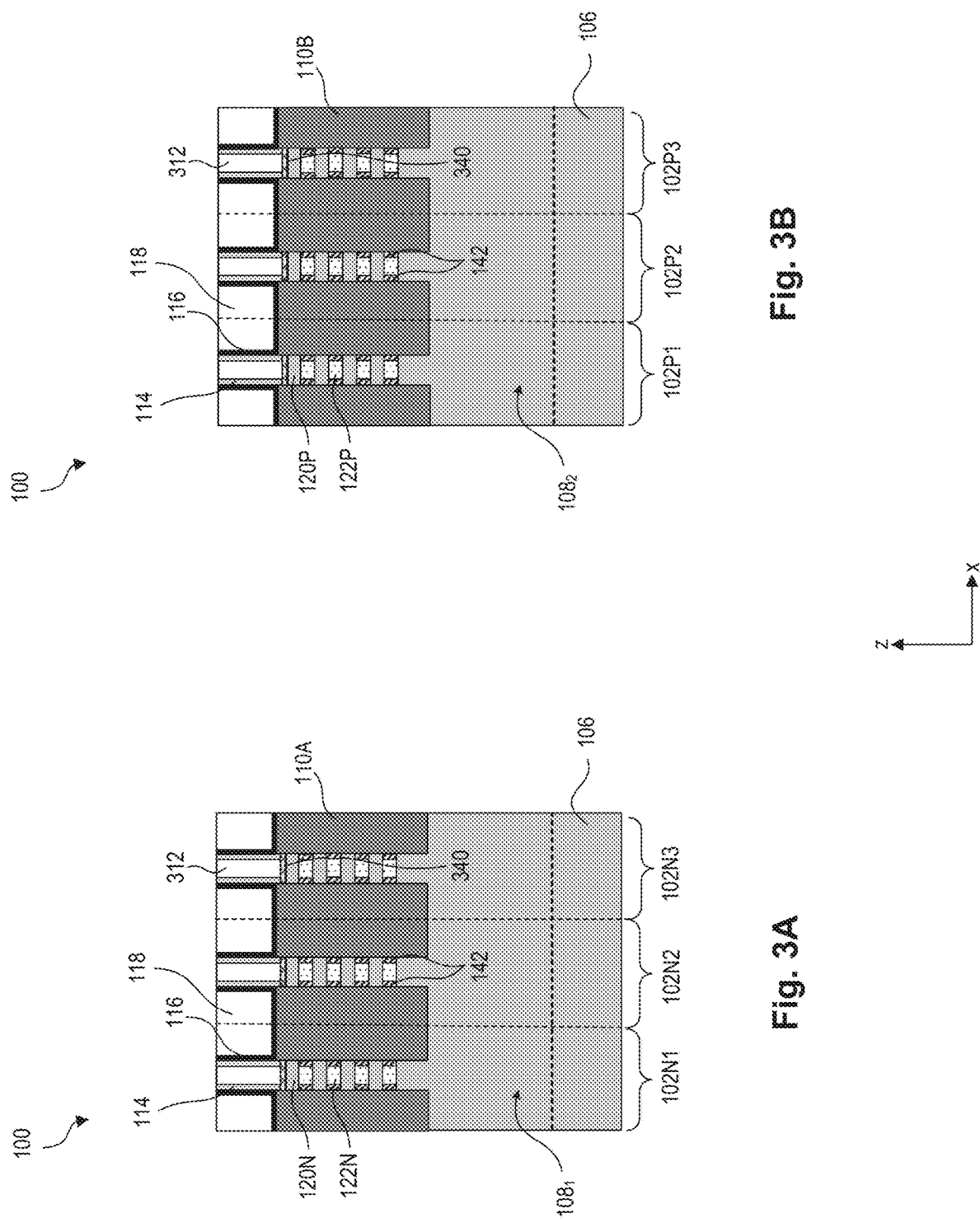

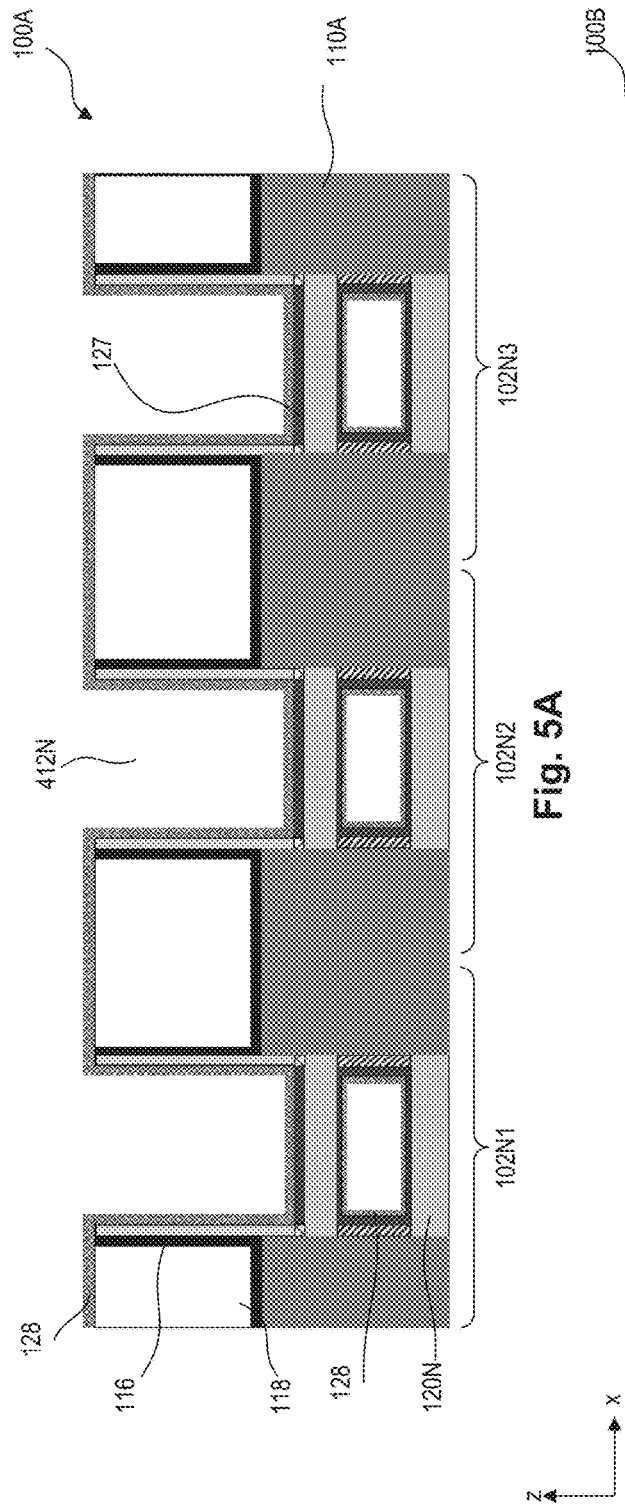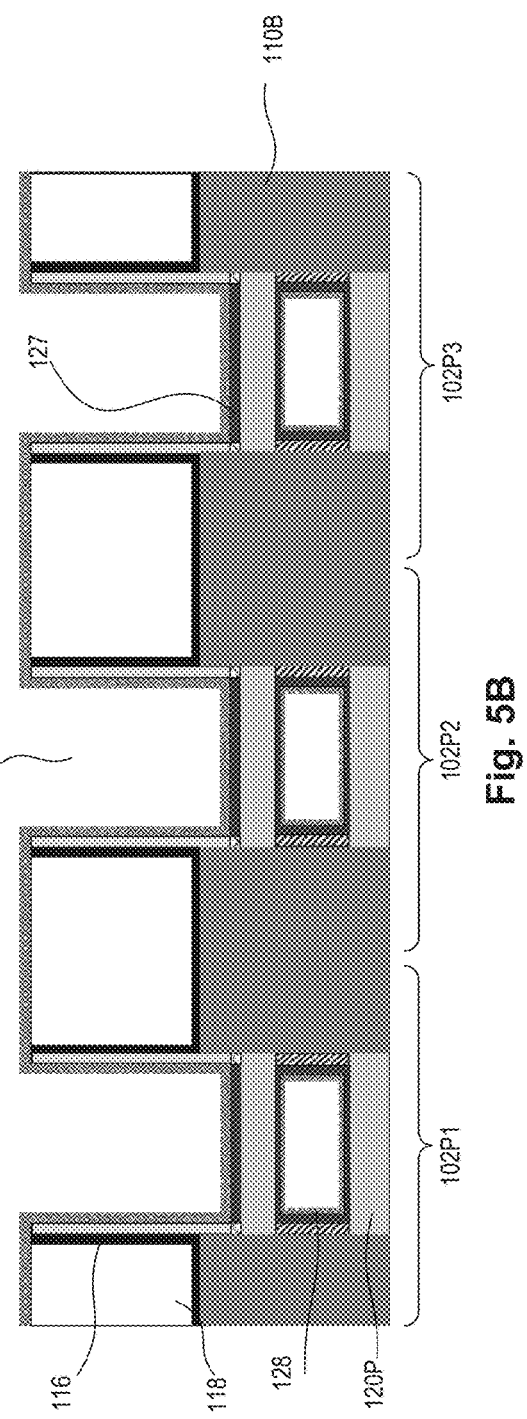

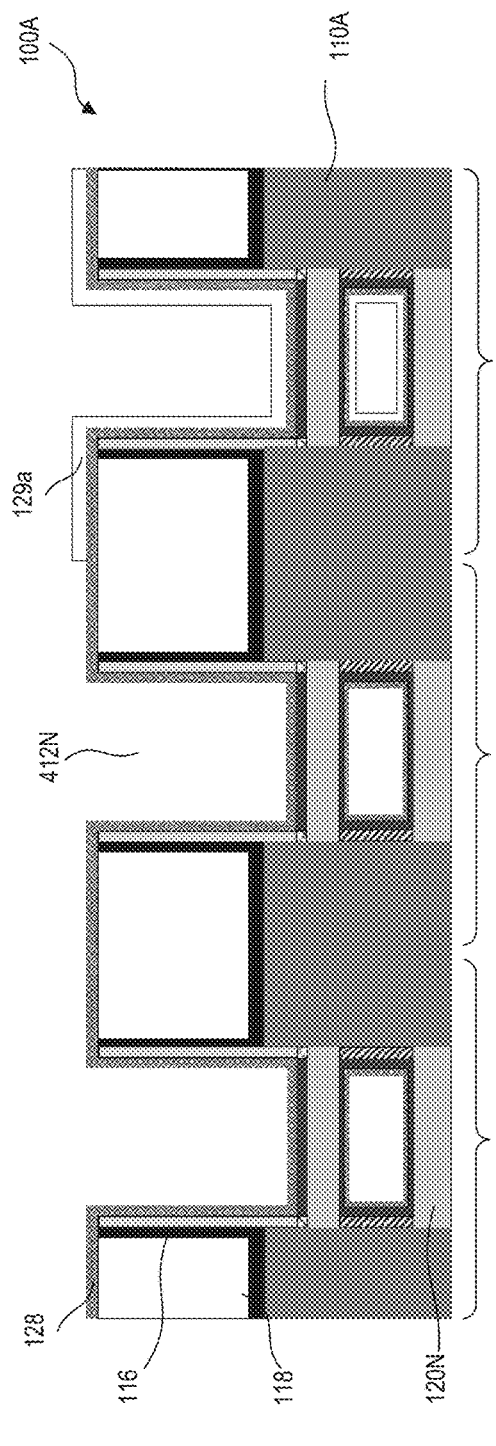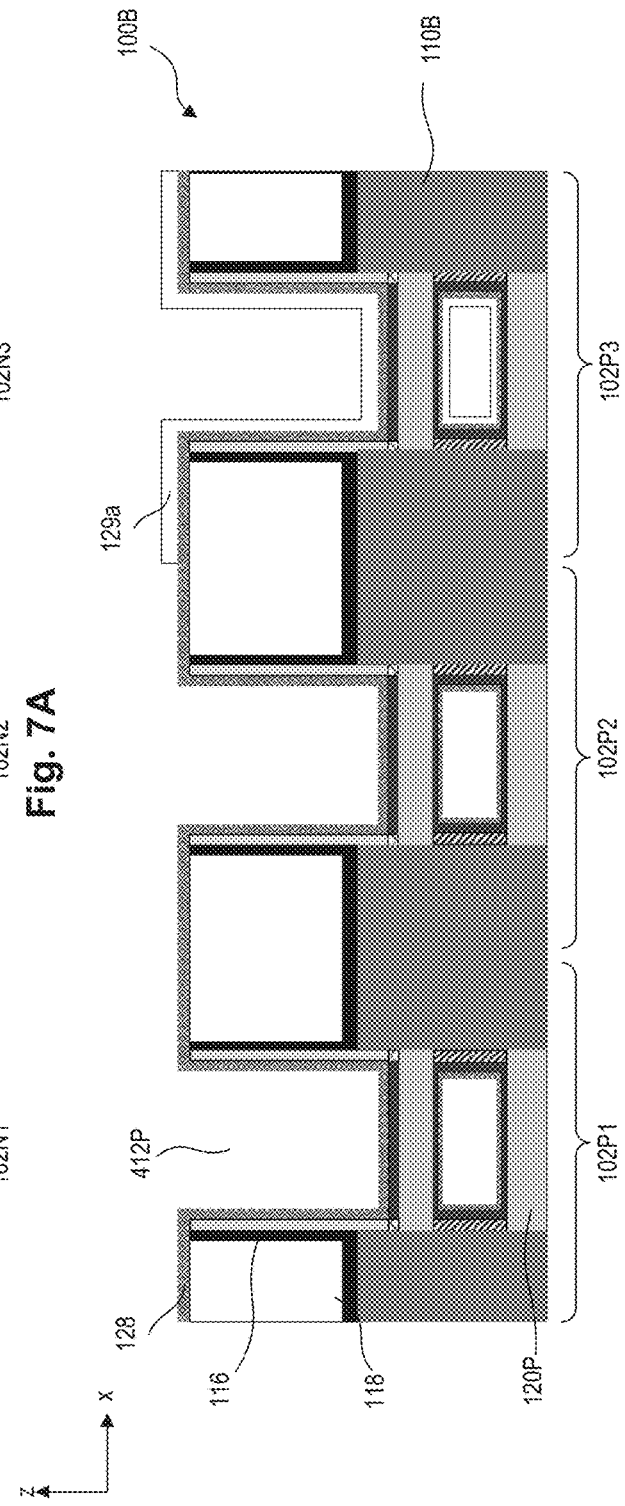

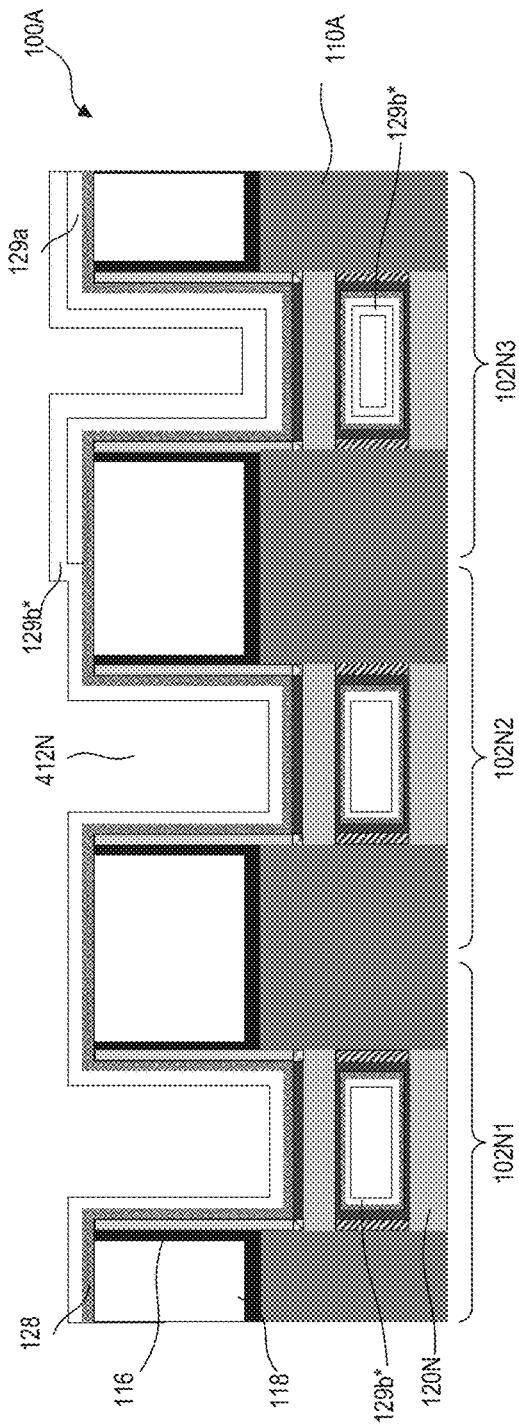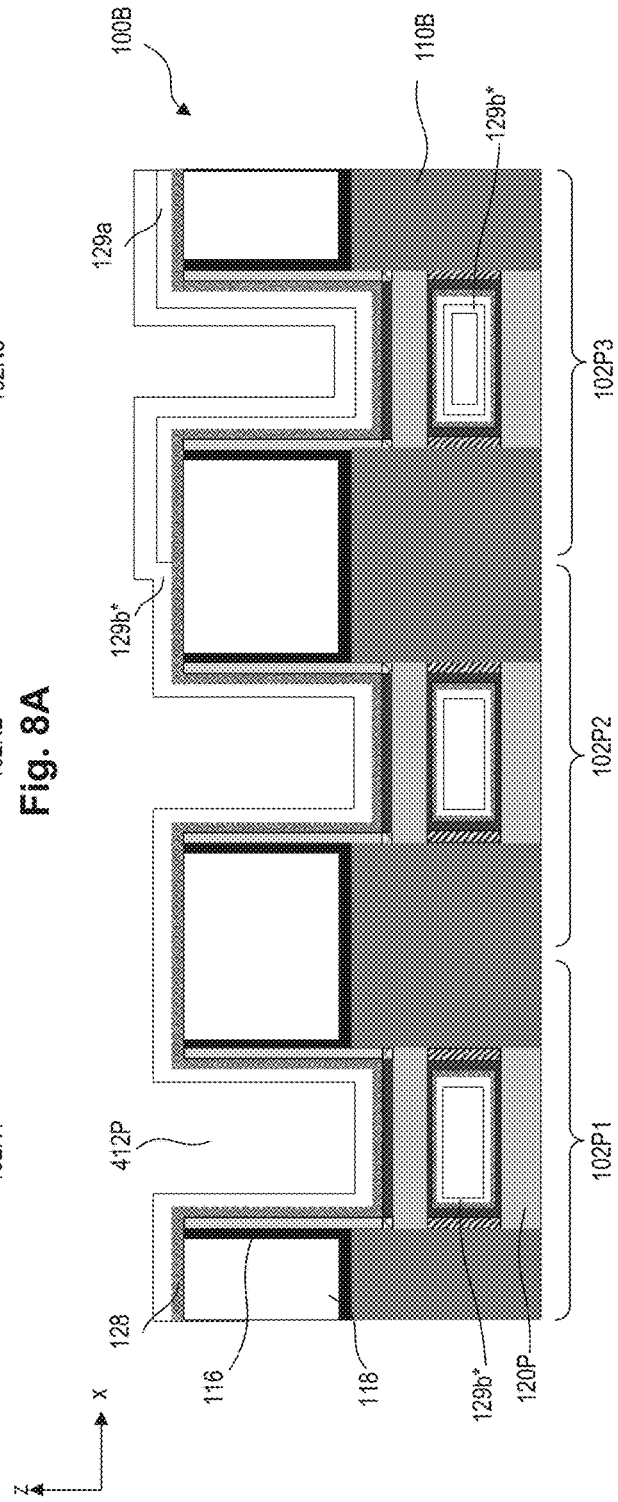

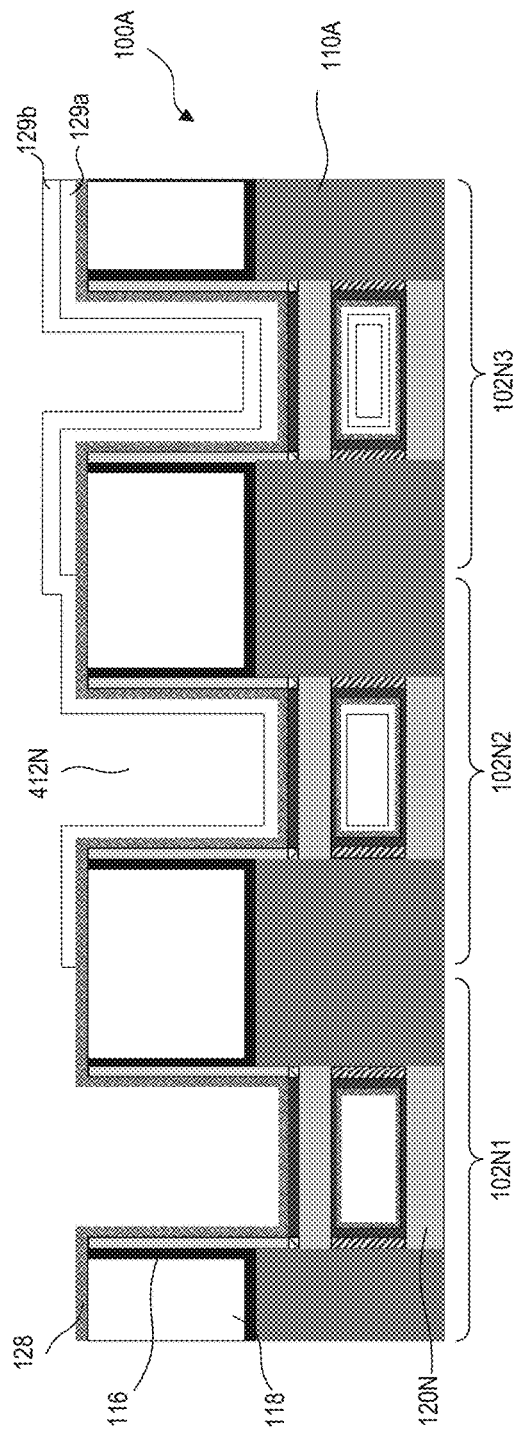
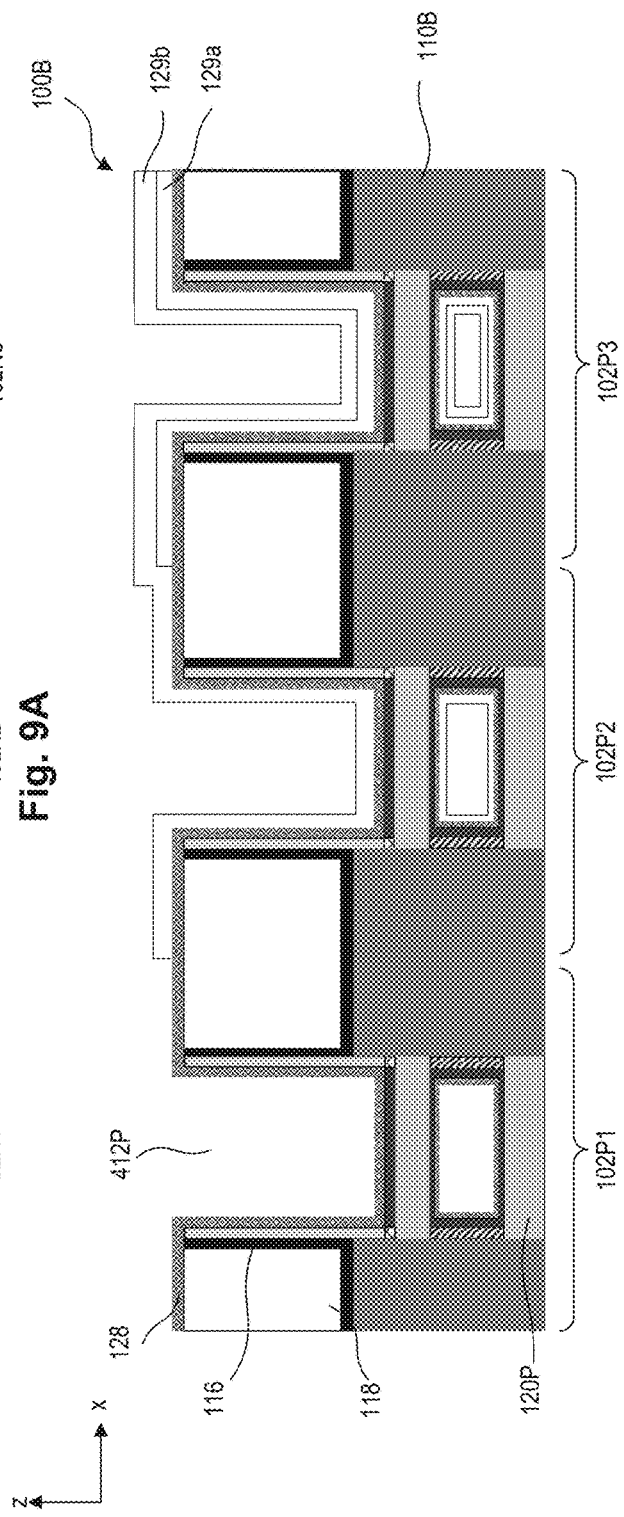
Fig. 9A
Fig. 9B

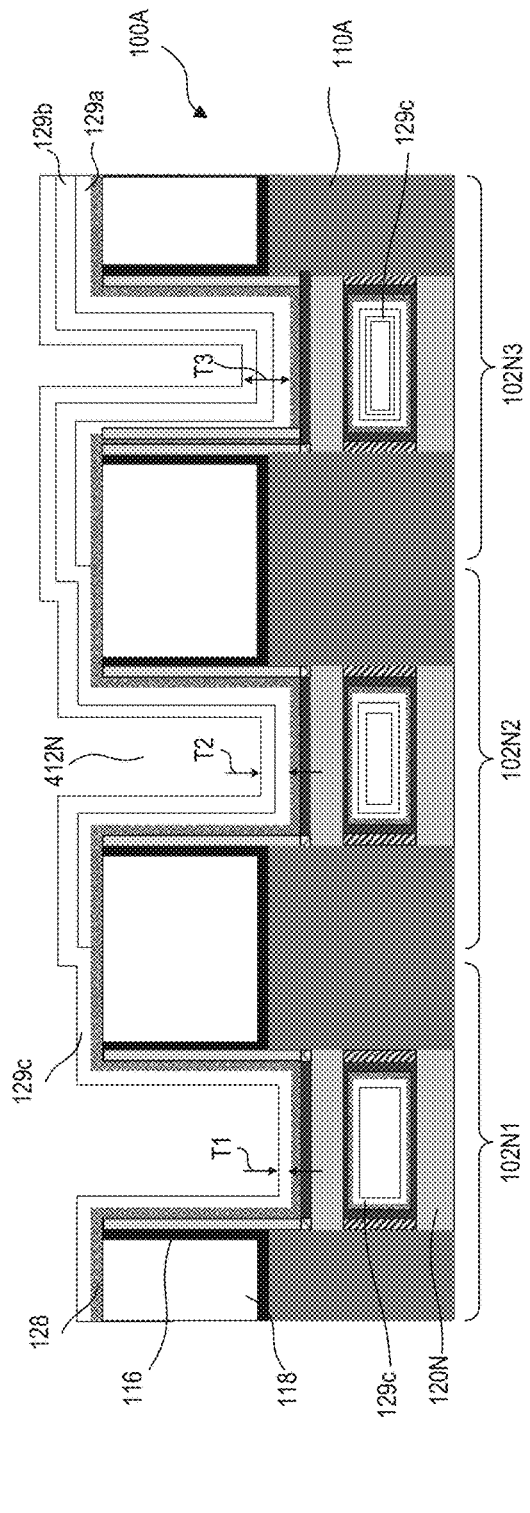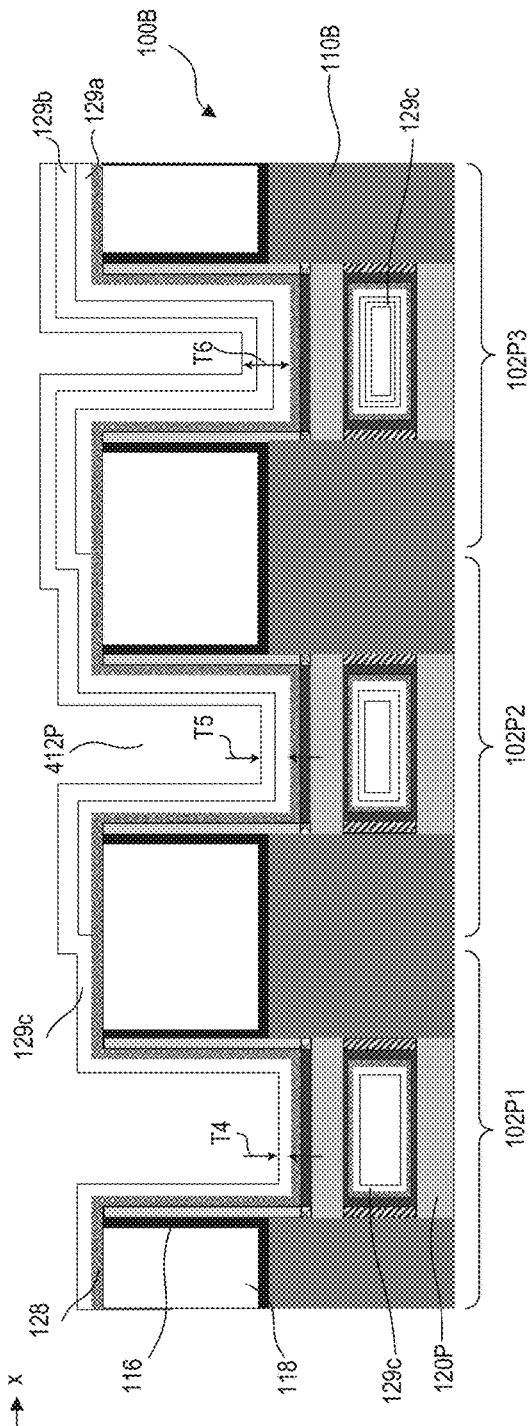

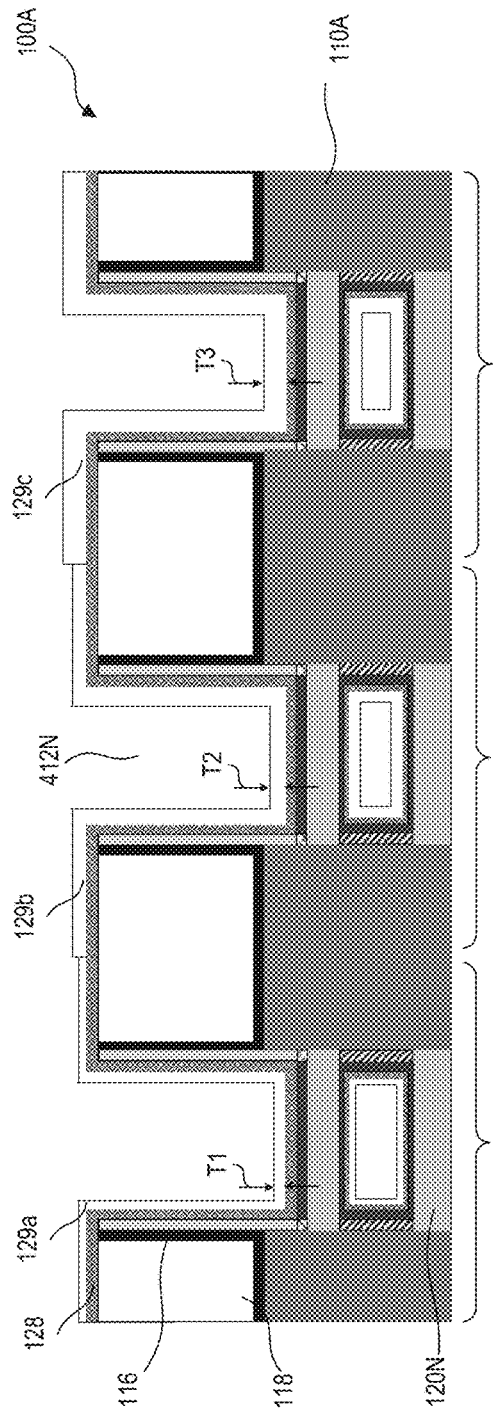
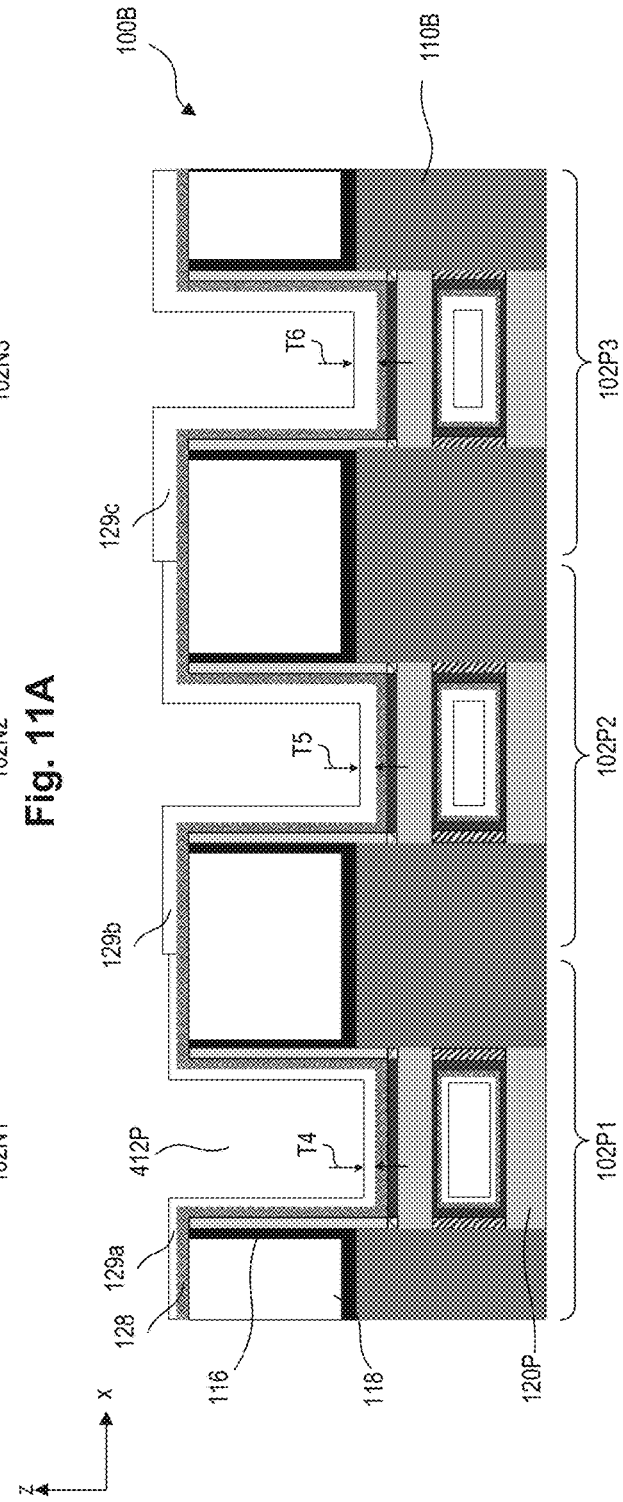
Fig. 11A
Fig. 11B

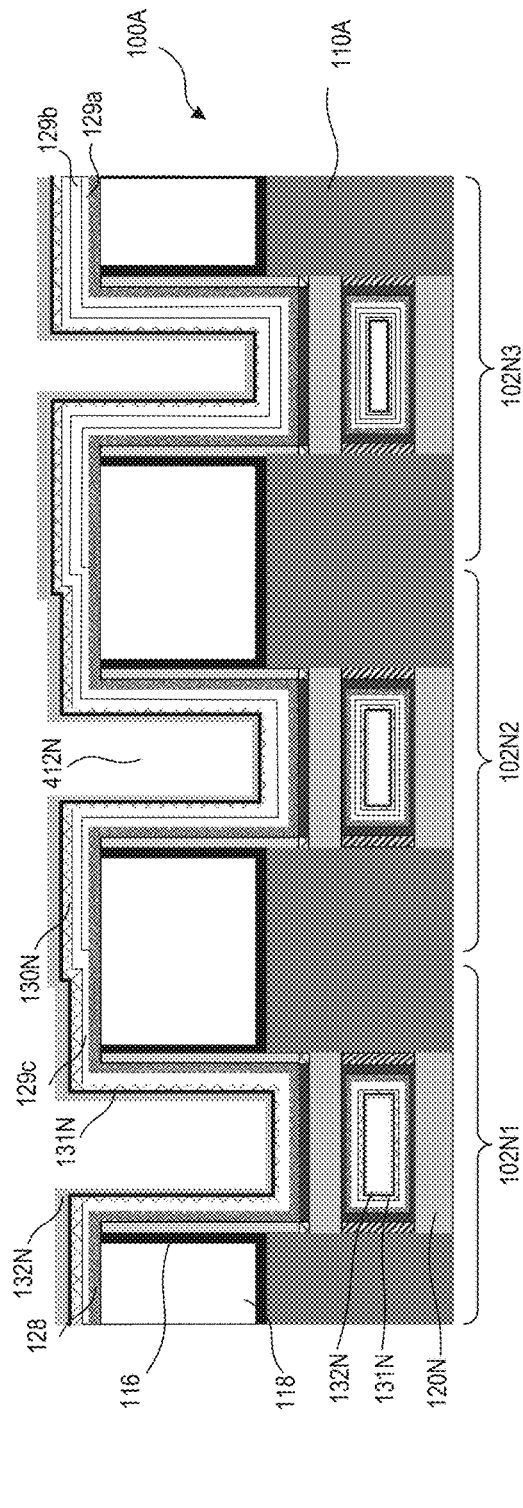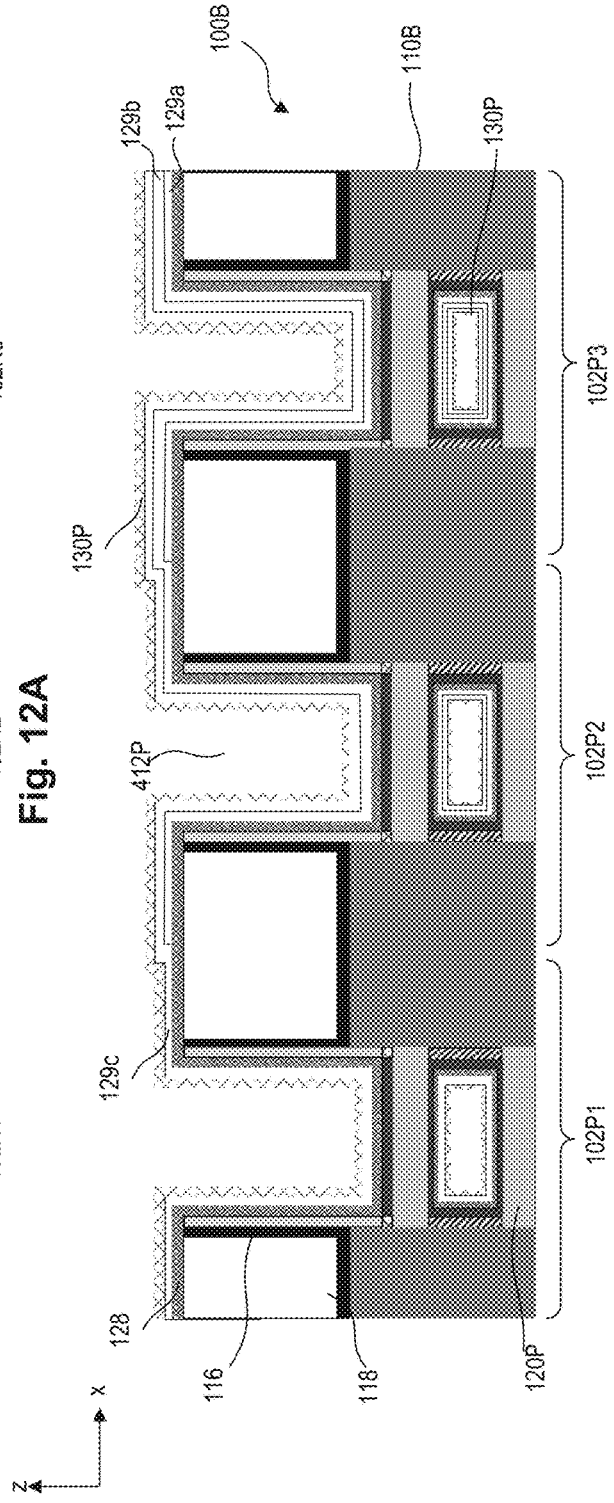

US 12,057,478 B2

GATE STRUCTURES FOR SEMICONDUCTOR DEVICES

CROSS-REFERENCE TO RELATED APPLICATIONS

This application is a continuation of U.S. patent application Ser. No. 16/835,916, titled "Gate Structures for Semiconductor Devices," filed Mar. 31, 2020, which claims the benefit of U.S. Provisional Patent Application No. 62/928,557, titled "Gate Structures for Threshold Voltage Tuning of FinFETs and Gate All Around FETs," filed Oct. 31, 2019, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1A, 1B-1E, and 1F-1O illustrate an isometric view, cross-sectional views, and device characteristics of a semiconductor device with different gate structures, in accordance with some embodiments.

FIGS. 3A-14B illustrate cross-sectional views of a semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
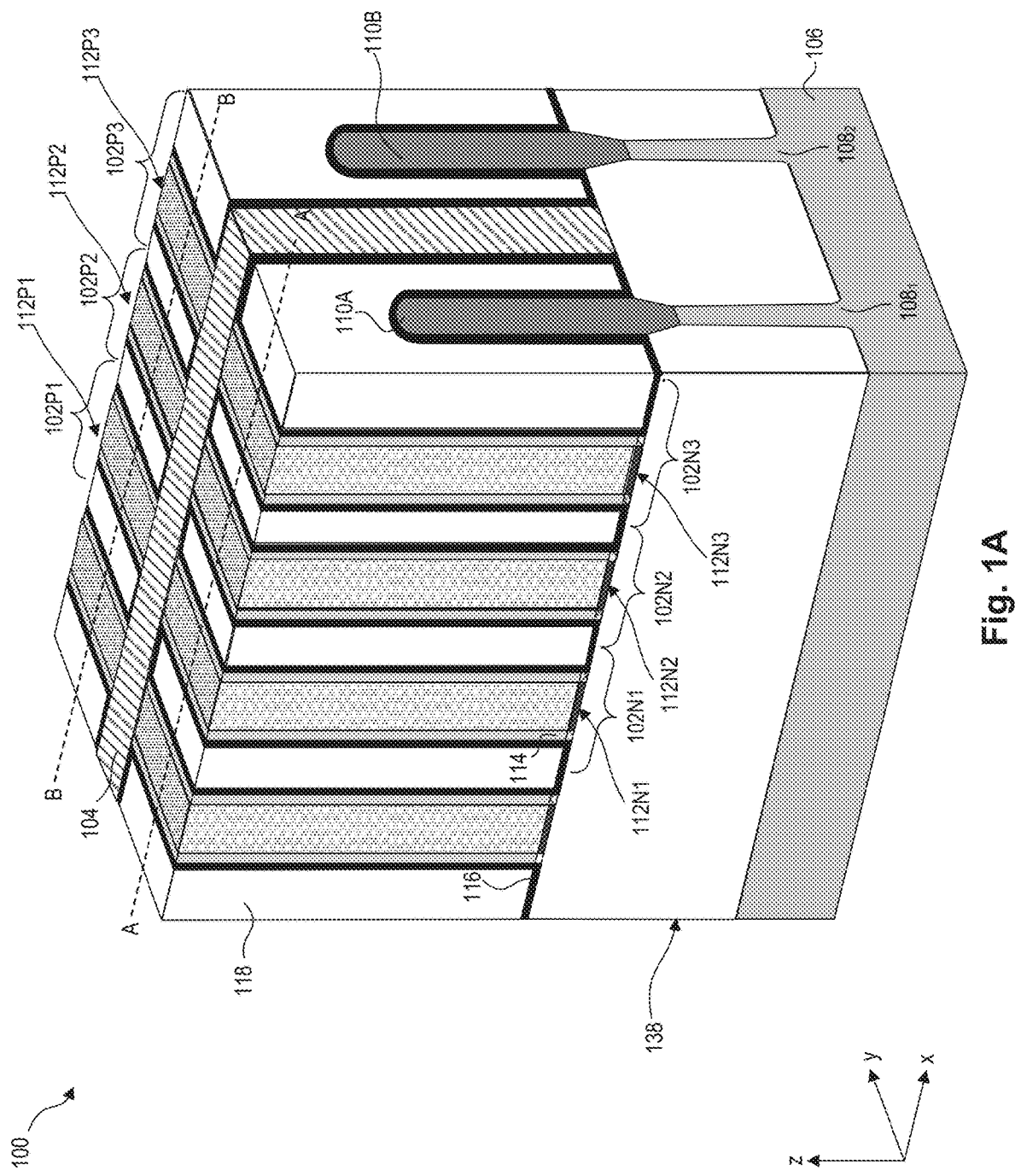

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region. In some embodiments, the term "p-type work function metal (pWFM)" defines a metal or a metal-containing material with a work function value equal to or greater than 4.5 eV.

In some embodiments, the terms "about" and "substantially" can indicate a value of a given quantity that varies within 5% of the value (e.g., ±1%, ±2%, ±3%, ±4%, ±5% of the value).

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage Vt—to turn on a field effect transistor (FET) can depend on the semiconductor material of the FET channel region and/or the effective work function (EWF) value of a gate structure of the FET. For example, for an n-type FET (NFET), reducing the difference between the EWF value(s) of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the EWF value(s) of the PFET gate structure and the valence band energy of the material (e.g., 5.2 eV for Si or 4.8 eV for SiGe) of the PFET channel region can reduce the PFET threshold voltage. The EWF values of the FET gate structures can depend on the thickness and/or material composition of each of the layers of the FET gate structure. As such, FETs can be manufactured with different threshold voltages by adjusting the thickness and/or material composition of the FET gate structures.

Due to the increasing demand for multi-functional portable devices, there is an increasing demand for FETs with different threshold voltages on the same substrate. One way to achieve such FETs can be with different work function metal (WFM) layer thicknesses in the FET gate structures. However, the different WFM layer thicknesses can be constrained by the FET gate structure geometries. For example, in gate-all-around (GAA) FETs, the WFM layer thicknesses can be constrained by the spacing between the nanostructured channel regions of the GAA FETs. Also, depositing different WFM layer thicknesses can become increasingly challenging with the continuous scaling down of FETs (e.g., GAA FETs and/or finFETs).

The present disclosure provides example FET gate structures with different EWF values to form FETs (e.g., GAA FETs and/or finFETs) with different threshold voltages and provides example methods of forming such FETs on a same substrate. The example methods form NFETs and PFETs with similar WFM layer thickness, but with different threshold voltages on the same substrate. These example methods can be less complicated and more cost-effective in manufacturing reliable gate structures with lower gate resistance in FETs with nanostructured channel regions and with different threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages.

In some embodiments, NFETs and PFETs with different gate structure configurations, but with similar WFM layer thicknesses can be selectively formed on the same substrate to achieve threshold voltages different from each other. The different gate structure configurations can have barrier metal layers of different thicknesses disposed between the WFM layers and high-K gate dielectric layers. In addition, the WFM layers can include WFM oxide layers that induce dipole layers at the interface between the WFM layers and the barrier metal layers. The different barrier metal layer thicknesses provide different spacings between the WFM layers and high-K gate dielectric layers and different spacings between the induced dipole layers and the high-K gate dielectric layers. These different spacings result in the FET gate structures having EWF values different from each other and consequently having threshold voltages different from each other. Thus, tuning the barrier metal layer thicknesses can tune the EWF values of the NFET and PFET gate structures and, as a result, adjust the threshold voltages of the NFETs and PFETs without varying their WFM layer thicknesses.

A semiconductor device 100 having NFETs 102N1-102N3 and PFETs 102P1-102P3 is described with reference to FIGS. 1A-1O, according to some embodiments. FIG. 1A illustrates an isometric view of semiconductor device 100, according to some embodiments. FIGS. 1B-1C and 1D-1E illustrate cross-sectional views along lines A-A and B-B of semiconductor device 100 of FIG. 1A, according to some embodiments. FIGS. 1F-1O illustrate devices characteristics of semiconductor device 100, according to some embodiments. Even though six FETs are discussed with reference to FIGS. 1A-1O, semiconductor device 100 can have any number of FETs. The discussion of elements of NFETs 102N1-102N3 and PFETs 102P1-102P3 with the same annotations applies to each other, unless mentioned otherwise. The isometric view and cross-sectional views of semiconductor device 100 are shown for illustration purposes and may not be drawn to scale.

Figure 1B:
Figure 1C:
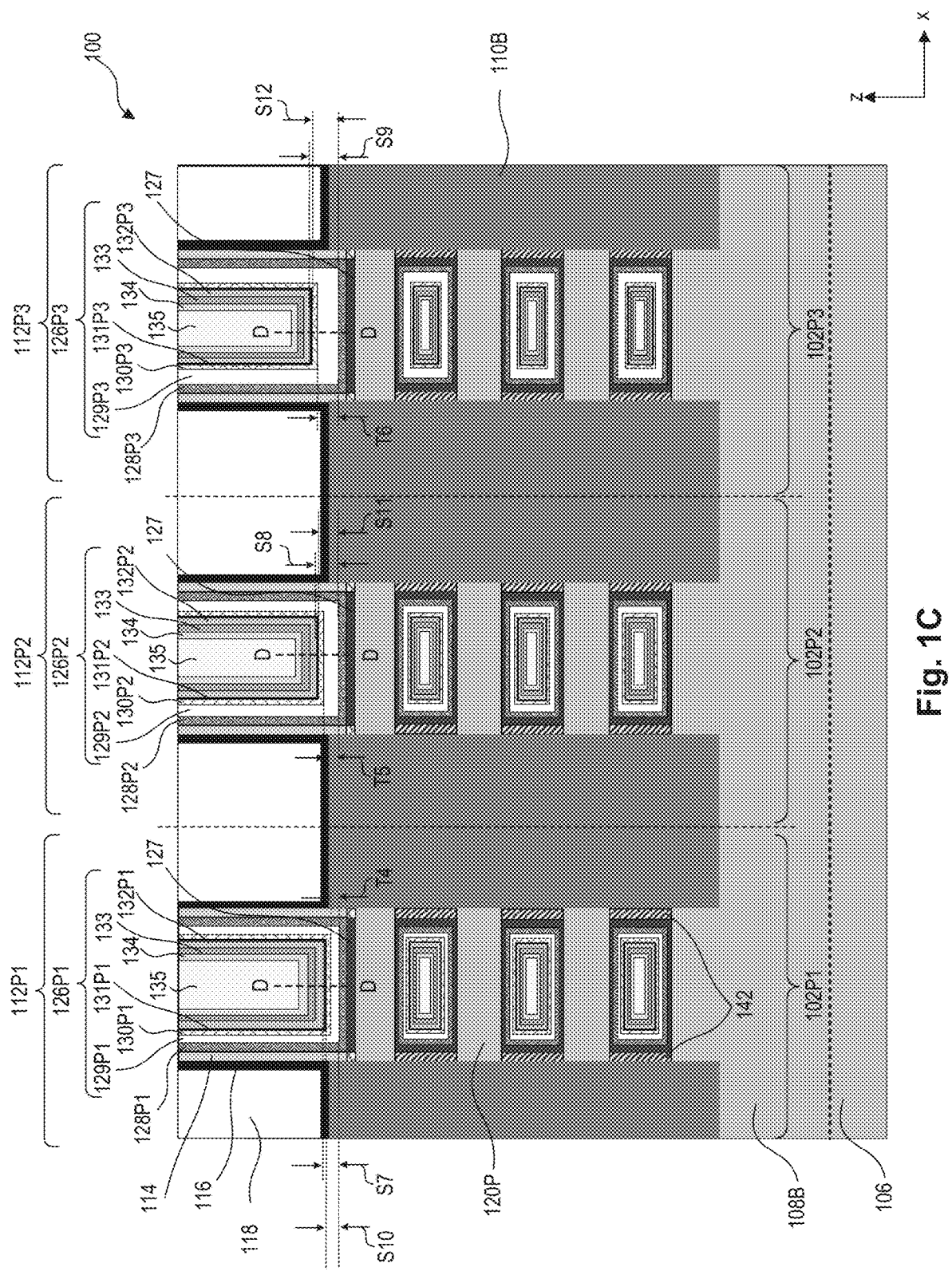

Referring to FIGS. 1A-1C, NFETs 102N1-102N3 and PFETs 102P1-102P3 can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor (e.g., germanium (Ge)); (ii) a compound semiconductor including III-V semiconductor material; (iii) an alloy semiconductor (e.g., silicon germanium (SiGe)); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped with p-type dopants (e.g., boron, indium, aluminum, or gallium) or n-type dopants (e.g., phosphorus or arsenic).

NFETs 102N1-102N3 and PFETs 102P1-102P3 can include fin structures $108_1$-$108_2$ extending along an X-axis, epitaxial fin regions 110A-110B, gate structures 112N1-112N3 and 112P1-112P3 inner spacers 142, and gate spacers 114.

Referring to FIGS. 1B-1C, fin structure $108_1$ can include a fin base portion 108A and nanostructured channel regions 120N disposed on fin base portion 108A and fin structure $108_2$ can include a fin base portion 108B and nanostructured channel regions 120P disposed on fin base portion 108B. In some embodiments, fin base portions 108A-108B can include a material similar to substrate 106. Nanostructured channel regions 120N can be wrapped around by gate structures 112N1-112N3 and nanostructured channel regions 120P can be wrapped around by gate structures 112P1-112P3. Nanostructured channel regions 120N-120P can include semiconductor materials similar to or different from substrate 106 and can include semiconductor material similar to or different from each other.

In some embodiments, nanostructured channel regions 120N can include Si, SiAs, silicon phosphide (SiP), SiC, or silicon carbon phosphide (SiCP) for NFETs 102N1-102N3 and nanostructured channel regions 120P can include SiGe, silicon germanium boron (SiGeB), germanium boron (GeB), silicon germanium stannum boron (SiGeSnB), or a III-V semiconductor compound for PFETs 102P1-102P3. In some embodiments, nanostructured channel regions 120N-120P can both include Si, SiAs, SiP, SiC, SiCP, SiGe, SiGeB, GeB, SiGeSnB, or a III-V semiconductor compound. Though rectangular cross-sections of nanostructured channel regions 120N-120P are shown, nanostructured channel regions 120N-120P can have cross-sections of other geometric shapes (e.g., circular, elliptical, triangular, or polygonal).

Referring to FIGS. 1A-1C, epitaxial fin regions 110A-110B can be grown on fin base portions 108A-108B, respectively, and can be source/drain (S/D) regions of NFETs 102N1-102N3 and PFETs 102P1-102P3. Epitaxial fin regions 110A-110B can include epitaxially-grown semiconductor materials similar to or different from each other. In some embodiments, the epitaxially-grown semiconductor material can include the same material or a different material from the material of substrate 106. Epitaxial fin regions 110A and 110B can be n- and p-type, respectively. In some embodiments, n-type epitaxial fin regions 110A can include SiAs, SiC, or SiCP. P-type epitaxial fin regions 110B can include SiGe, SiGeB, GeB, SiGeSnB, a III-V semiconductor compound, or a combination thereof.

Gate structures 112N1-112N3 and 112P1-112P3 can be multi-layered structures. Gate structures 112N1-112N3 can be wrapped around nanostructured channel regions 120N and gate structures 112P1-112P3 can be wrapped around nanostructured channel regions 120P for which gate structures 112N1-112N3 and 112P1-112P3 can be referred to as "gate-all-around (GAA) structures" or "horizontal gate-all-around (HGAA) structures." NFETs 102N1-102N3 and PFETs 102P1-102P3 can be referred to as "GAA FETs 102N1-102N3 and 102P1-102P3" or "GAA NFETs 102N1-102N3 and PFETs 102P1-102P3," respectively.

Figure 1D:
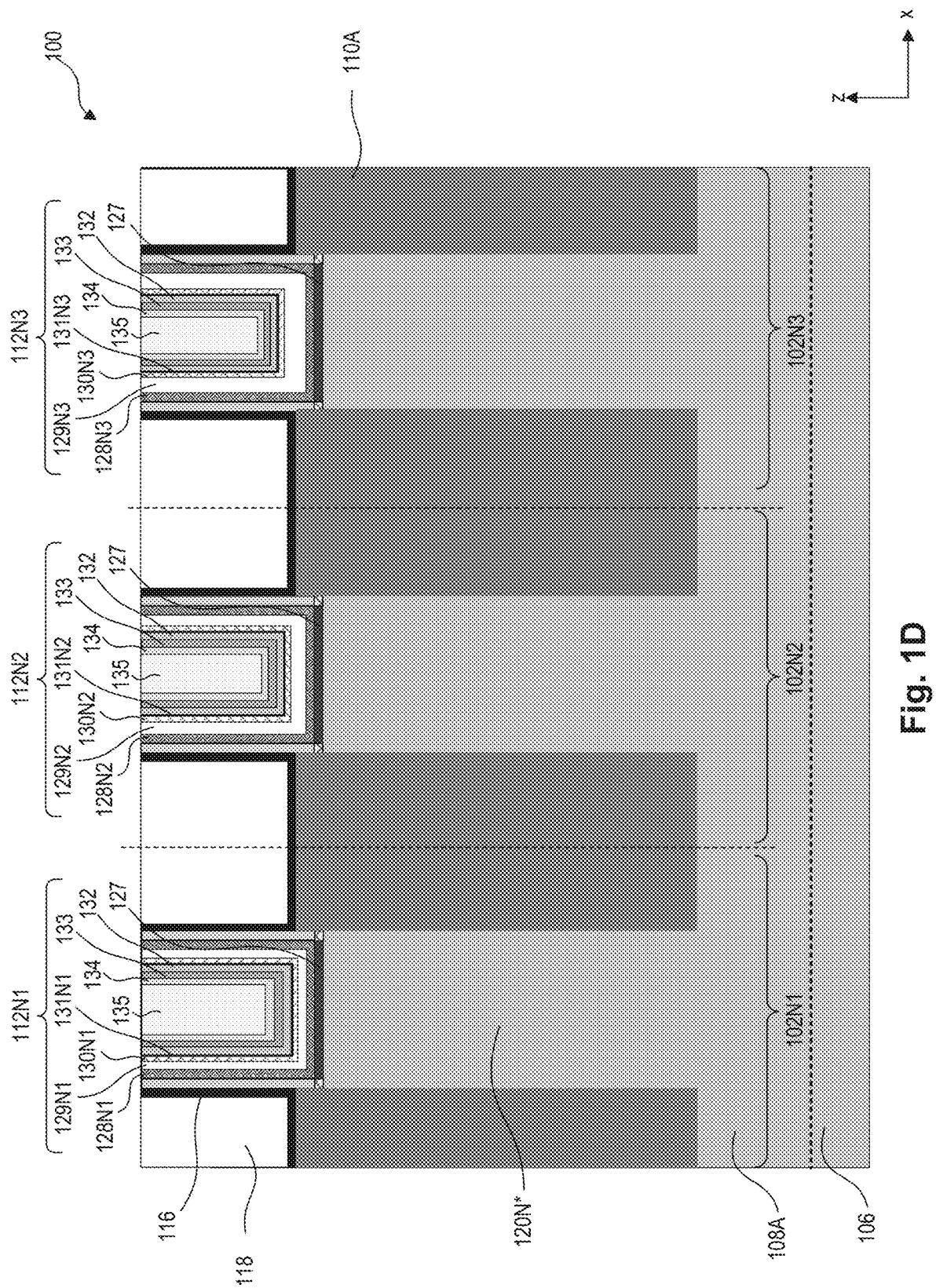
Figure 1E:
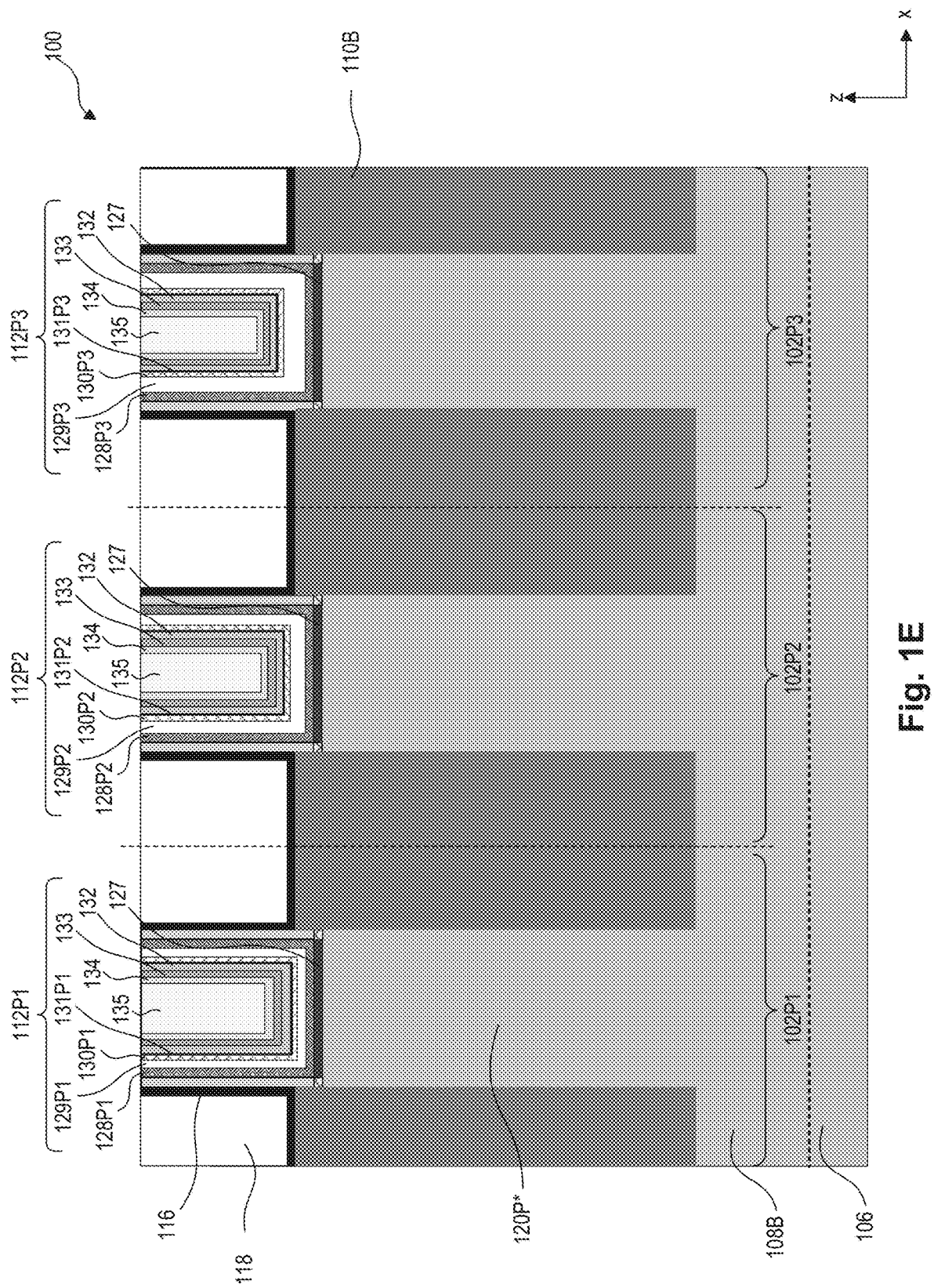

In some embodiments, NFETs 102N1-102N3 and PFETs 102P1-102P3 can be finFETs and have fin regions 120N*-120P* instead of nanostructures channel regions 120N-120P, as shown in FIGS. 1D-1E. Such finFETs 102N1-102N3 and 102P1-102P3 can have gate structures 112N1-112N3 and 112P1-112P3 disposed on fin regions 120N*-120P* as shown in FIGS. 1D-1E, respectively.

Gate structures 112N1-112N3 and 112P1-112P3 can include interfacial oxide layers 127, high-k (HK) gate dielectric layers 128N1-128N3 and 128P1-128P3, first barrier metal layers 129N1-129N3 and 129P1-129P3, barrier metal oxide layers 130N1-130N3 and 130P1-130P3, dipole layers 131N1-131N3 and 131P1-131P3, WFM oxide layers 132N1-132N3 and 132P1-132P3, second barrier metal layers 133, fluorine-free tungsten (FFW) layers 134, and gate metal fill layers 135. Even though FIGS. 1B-1C show that all the layers of gate structures 112N1-112N3 and 112P1-112P3 are wrapped around nanostructured channel regions 120N-120P, nanostructured channel regions 120N-120P can be wrapped around by at least interfacial oxide layers 127 and HK gate dielectric layers 128N1-128N3 and 128P1-128P3 to fill the spaces between adjacent nanostructured channel regions 120N-120P. As such, nanostructured channel regions 120N can be electrically isolated from each other to prevent shorting between gate structures 112N1-112N3 and S/D regions 110A during operation of NFETs 102N1-102N3. Similarly, nanostructured channel regions 120P can be electrically isolated from each other to prevent shorting between gate structures 112P1-112P3 and S/D regions 110B during operation of PFETs 102P1-102P3.

Interfacial oxide layers 127 can be disposed on nanostructured channel regions 120N-120P and can include silicon oxide and a thickness ranging from about 0.5 nm to about 1.5 nm. Each of HK gate dielectric layers 128N1-128N3 and 128P1-128P3 can have a thickness (e.g., about 1 nm to about 3 nm) that is about 2 to 3 times the thickness of interfacial oxide layers 127 and can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$) and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or (iii) a combination thereof.

First barrier metal layers 129N1-129N3 and 129P1-129P3 can be disposed on and in physical contact with HK gate dielectric layers 128N1-128N3 and 128P1-128P3, respectively. In some embodiments, first barrier metal layers 129N1-129N3 and 129P1-129P3 can include metal nitrides (e.g., TiN and/or TaN) or any material that can prevent material diffusion from overlying layers (e.g., WFM oxide layers 132N1-132N3 and 132P1-132P3) to HK gate dielectric layers 128N1-128N3 and 128P1-128P3. Each first barrier metal layers 129N1-129N3 and 129P1-129P3 can include a single layer of metal nitride or a stack of metal nitride layers. The stack of metal nitride layers can include two or more metal nitride layers that are similar to or different from each other.

Referring to FIG. 1B, thicknesses T1-T3 of first barrier metal layers 129N1-129N3 can be different from each other to provide different spacings S1-S3 between WFM metal oxide layers 132N1-132N3 and HK gate dielectric layers 128N1-128N3, respectively. The different thicknesses T1-T3 can also provide different spacings S4-S6 between dipole layers 131N1-131N3 and HK gate dielectric layers 128N1-128N3. In some embodiments, thickness T3 is greater than thickness T2, which is greater than thickness T1. As a result, spacings S3 and S6 can be greater than spacings S2 and S5, which can be greater than spacings S1 and S4, respectively. The different spacings S1-S3 and/or S4-S6 can result in gate structures 112N1-112N3 having EWF values E1-E3 different from each other and consequently having threshold voltages V1-V3 different from each other. Thicknesses T1-T3 and S4-S6 can be directly proportional to EWF values E1-E3 and threshold voltages V1-V3 as shown in FIGS. 1F-1I.

Similarly, referring to FIG. 1C, thicknesses T4-T6 of first barrier metal layers 129P1-129P3 can be different from each other to provide different spacings S7-S9 between WFM metal oxide layers 132P1-132P3 and HK gate dielectric layers 128P1-128P3. The different thicknesses T4-T6 can also provide different spacings S10-S12 between dipole layers 131P1-131P3 and HK gate dielectric layers 128P1-128P3. Thickness T6 is greater than thickness T5, which is greater than thickness T4. As a result, spacings S7 and S10 can be greater than spacings S8 and S11, which can be greater than spacings S9 and S12, respectively. The different spacings S7-S9 and/or S10-S12 can result in gate structures 112P1-112P3 having EWF values E4-E6 different from each other and consequently having threshold voltages V4-V6 different from each other. Thicknesses T4-T6 and S10-S12 can be directly proportional to EWF values E4-E6 and indirectly proportional to threshold voltages V4-V6 as shown in FIGS. 1J-1M.

In some embodiments, thicknesses T1-T3 can be similar to or different from thicknesses T4-T6, respectively. Even with thicknesses T1-T3 similar to respective thicknesses T4-T6, threshold voltages V1-V3 can be different from threshold voltages V4-V6, respectively. In some embodiments, thicknesses T1-T6 can range from about 0.5 nm to about 3 nm.

Barrier metal oxide layers 130N1-130N3 and 130P1-130P3 can be disposed on first barrier metal layers 129N1-129N3 and 129P1-129P3, respectively. In some embodiments, barrier metal oxide layers 130N1-130N3 and 130P1-130P3 can include an oxide of the metal included in metal nitrides of first barrier metal layers 129N1-129N3 and 129P1-129P3. For example, barrier metal oxide layers 130N1-130N3 and 130P1-130P3 can include an oxide of Ti (e.g., $TiO_x$) or Ta (e.g., $TaO_x$) when TiN or TaN is included in first barrier metal layers 129N1-129N3 and 129P1-129P3. In some embodiments, thicknesses of each barrier metal oxide layers 130N1-130N3 and 130P1-130P3 can range from about 0.1 nm to about 0.2 nm. Barrier metal oxide layers 130P1-130P3 are thicker than barrier metal oxide layers 130N1-130N3 as a result of first barrier metal layers 129P1-129P3 being oxidized more times than first barrier metal layers 129N1-129N3 during the fabrication of gate structures 112N1-112N3 and 112P1-112P3 as described below with reference to FIGS. 3A-14B.

WFM oxide layers 132N1-132N3 and 132P1-132P3 can be disposed on and in physical contact with barrier metal oxide layers 130N1-130N3 and 130P1-130P3, respectively. For NFETs 102N1-102N3, n-type WFM oxide layers 132N1-132N3 (also referred to as "nWFM oxide layers 132N1-132N3") can include oxides of Al-free (e.g., with no Al) metals. In some embodiments, WFM oxide layers 132N1-132N3 can include (i) rare-earth metal (REM) oxides, such as lanthanum oxide ($La_2O_3$), cerium oxide ($CeO_2$), ytterbium oxide ($Yb_2O_3$), lutetium oxide ($Lu_2O_3$), and erbium oxide ($Er_2O_3$); (ii) oxides of a metal from group IIA (e.g., magnesium oxide (MgO) or strontium oxide (SrO)), group IIIB (e.g., yttrium oxide ($Y_2O_3$)), group IVB (e.g., hafnium oxide ($HfO_2$) or zirconium oxide ($ZrO_2$)), or group VB (e.g., tantalum oxide ($Ta_2O_5$)) of the periodic table; (iii) silicon dioxide ($SiO_2$); or (iv) a combination thereof.

In contrast, for PFETs 102P1-102P3, p-type WFM oxide layers 132P1-132P3 132N3 (also referred to as "pWFM oxide layers 132P1-132P3") can include (i) Al-based metal oxides, such as aluminum oxide ($Al_2O_3$) and aluminum titanium oxide ($Al_2TiO_5$); (ii) oxides of a metal from group VB (e.g., niobium oxide (NbO)), group IIIA (e.g., boron oxide $B_2O_3$), group VA (e.g., phosphorus oxide ($P_2O_5$)) of the periodic table; or (iii) a combination thereof. In some embodiments, thicknesses of each WFM oxide layers 132N1-132N3 and 132P1-132P3 can range from about 0.01 nm to about 2 nm. The thickness within this range can allow WFM oxide layers 132N1-132N3 and 132P1-132P3 to wrap around nanostructured channel regions 120N-120P without being constrained by the spacing between adjacent nanostructured channel regions 120N-120P.

The thickness of WFM oxide layers 132N1-132N3 and 132P1-132P3 can be similar to or different from each other, but the materials of WFM oxide layers 132N1-132N3 are different from the materials of WFM oxide layers 132P1-132P3. In some embodiments, the materials of WFM oxide layers 132N1-132N3 can include a metal oxide with a work function value closer to a conduction band energy than a valence band energy of a material of nanostructured channel regions 120N. In contrast, the materials of WFM oxide layers 132P1-132P3 can include a metal oxide with a work function value closer to a valence band energy than a conduction band energy of a material of nanostructured channel regions 120P.

WFM oxide layers 132N1-132N3 induces dipole layers 131N1-131N3 at the interfaces between WFM oxide layers 132N1-132N3 and barrier metal oxide layers 130N1-130N3. WFM oxide layers 132P1-132P3 induces dipole layers 131P1-131P3 at the interfaces between WFM oxide layers 132P1-132P3 and barrier metal oxide layers 130P1-130P3. Dipole layers 131N1-131N3 and 131P1-131P3 can have dipoles of metal ions and oxygen ions. The metal ions (e.g., La ions) of dipole layers 131N1-131N3 diffuse from the metal oxides (e.g., $La_2O_3$) of WFM oxide layers 132N1-132N3 and the oxygen ions of dipole layers 131N1-131N3 diffuse from barrier metal oxide layers 130N1-130N3. Similarly, the metal ions (e.g., Al ions) of dipole layers 131P1-131P3 diffuse from the metal oxides (e.g., $Al_2O_3$) of WFM oxide layers 132P1-132P3 and the oxygen ions of dipole layers 131P1-131P3 diffuse from barrier metal oxide layers 130P1-130P3. The dipoles of dipole layers 131N1-131N3 can have a polarity opposite to a polarity of the dipoles of dipole layers 131P1-131P3. In some embodiments, the concentration of dipoles in dipole layers 131N1-131N3 and 131P1-131P3 can similar to or different from each other.

Second barrier metal layers 133 can be disposed on and in physical contact with WFM oxide layers 132N1-132N3 and 132P1-132P3. In some embodiments, second barrier metal layers 133 can include metal nitrides (e.g., TiN and/or TaN) and can have a thickness ranging from about 1.5 nm to about 3 nm. In some embodiments, the material composition of second barrier metal layers 133 can be similar to the material composition of first barrier metal layers 129N1-129N3 and/or 129P1-129P3.

FFW layers 134 can be disposed on and in physical contact with second barrier metal layers 133. FFW layers 134 can prevent any substantial diffusion of fluorine (e.g., no fluorine diffusion) from fluorine-based precursors used during the deposition of overlying gate metal fill layers 135 to underlying layers, such as interfacial oxide layers 127, HK gate dielectric layers 128N1-128N3 and 128P1-128P3, first barrier metal layers 129N1-129N3 and 129P1-129P3, WFM oxide layers 132N1-132N3 and 132P1-132P3, and second barrier metal layers 133. FFW layers 134 can include substantially fluorine-free tungsten layers. The substantially fluorine-free tungsten layers can include an amount of fluorine contaminants less than about 5 atomic percent in the form of ions, atoms, and/or molecules. In some embodiments, FFW layers 134 can each have a thickness ranging from about 2 nm to about 4 nm for effective blocking of fluorine diffusion from gate metal fill layers 135.

Gate metal fill layers 135 can each include a single metal layer or a stack of metal layers. The stack of metal layers can include metals different from each other. In some embodiments, gate metal fill layers 135 can include a suitable conductive material, such as W, Ti, silver (Ag), ruthenium (Ru), molybdenum (Mo), copper (Cu), cobalt (Co), Al, iridium (Ir), nickel (Ni), metal alloys, and combinations thereof.

Figure 1N:
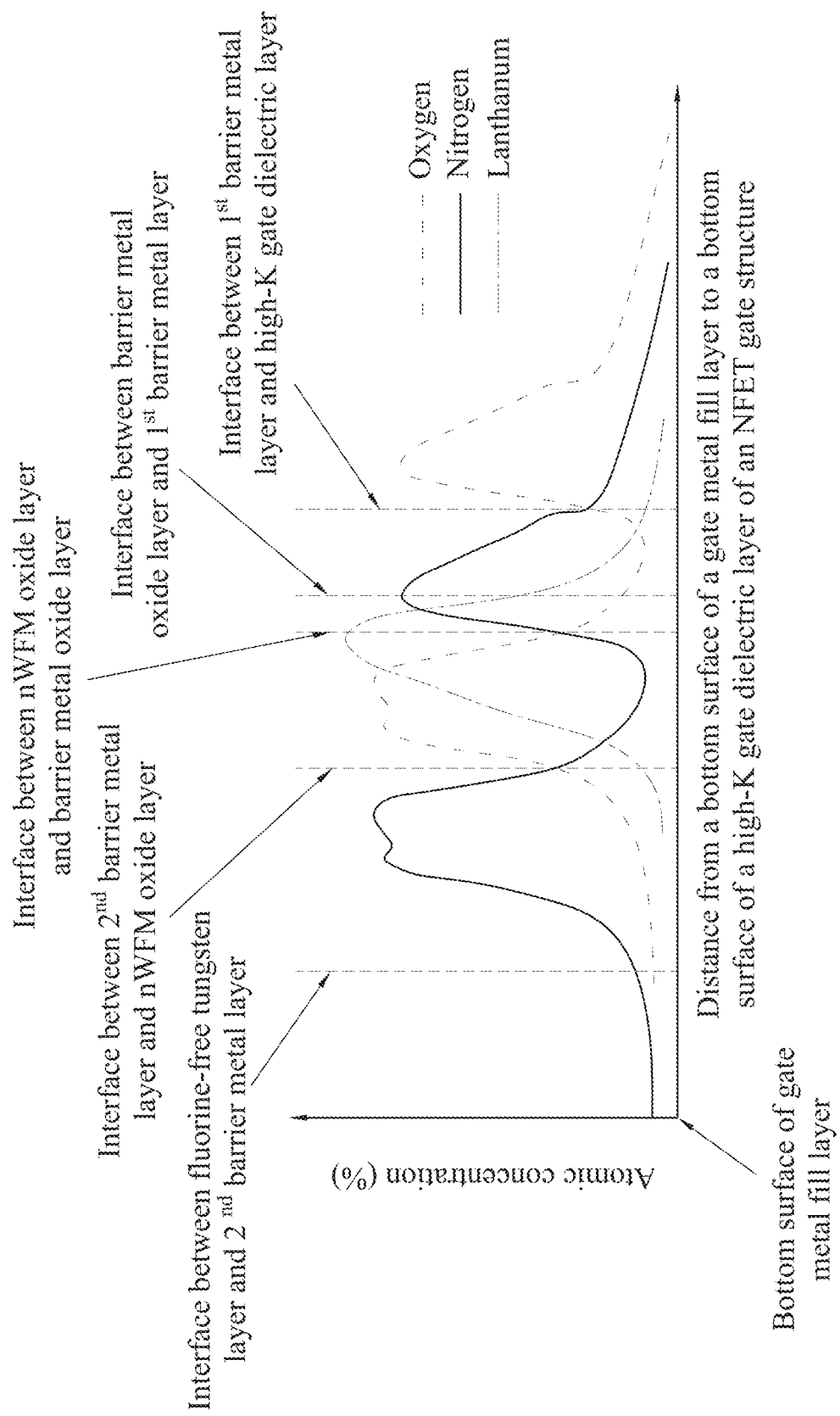
Figure 10:
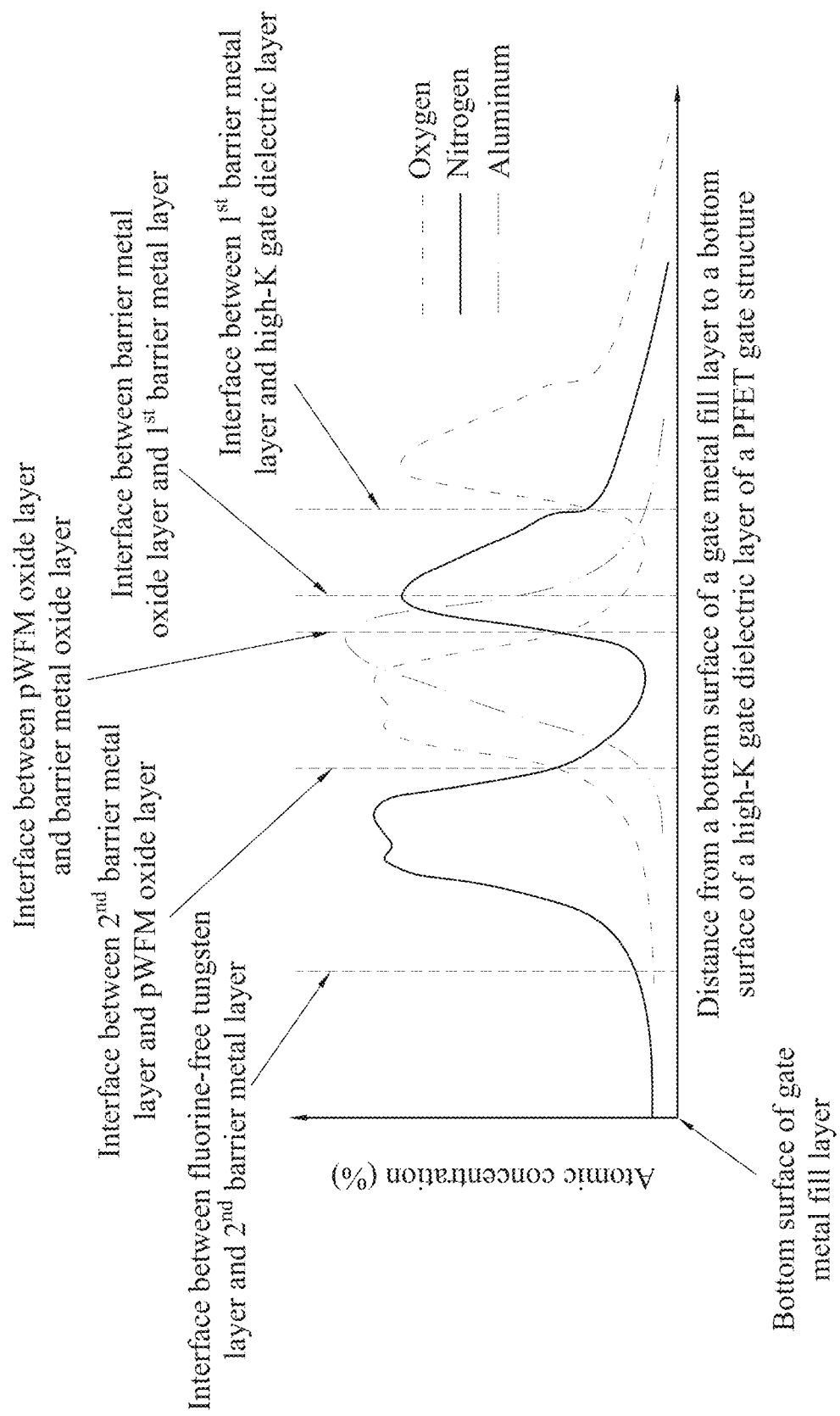

FIG. 1N illustrates the atomic concentration profiles of oxygen, nitrogen, and lanthanum atoms along lines C of FIG. 1B when WFM oxide layers 132N1-132N3 include $La_2O_3$. As shown in FIG. 1N, the atomic concentration profile of La atoms can have a peak at the interfaces between WFM oxide layers 132N1-132N3 and barrier metal oxide layers 130N1-130N3, respectively.

FIG. 1O illustrates the atomic concentration profiles of oxygen, nitrogen, and lanthanum atoms along lines D of FIG. 1C when WFM oxide layers 132P1-132P3 include $Al_2O_3$. As shown in FIG. 1O, the atomic concentration profile of Al atoms can have a peak at the interfaces between WFM oxide layers 132P1-132P3 and barrier metal oxide layers 130P1-130P3.

Referring back to FIGS. 1B-1E, gate spacers 114 and inner spacers 142 can form sidewalls of gate structures 112N1-112N3 and 112P1-112P3. Each of gate spacers 114 and/or inner spacers 142 can be in physical contact with interfacial oxide layers 127 and HK gate dielectric layers 128N1-128N3 and 128P1-128P3, according to some embodiments. Each of gate spacers 114 and inner spacer 142 can include insulating material, such as silicon oxide, silicon nitride, a low-k material, and a combination thereof. Each of gate spacers 114 and inner spacers 142 can have a low-k material with a dielectric constant less than about 3.9.

Semiconductor device 100 can further include etch stop layer (ESL) 116, interlayer dielectric (ILD) layer 118, and shallow trench isolation (STI) regions 138. ESL 116 can be disposed on sidewalls of gate spacers 114 and on epitaxial fin regions 110A-110B. ESL 116 can be configured to protect gate structures 112N1-112N3 and 112P1-112P3 and/or S/D regions 110A-110B. In some embodiments, ESL 116 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material is silicon oxide. STI regions 138 can be configured to provide electrical isolation between NFETs 102N1-102N3 and PFETs 102P1-102P3 and neighboring FETs (not shown) on substrate 106 and/or neighboring active and passive elements (not shown) integrated with or deposited on substrate 106. In some embodiments, STI regions 138 can include silicon oxide, silicon nitride, silicon oxynitride, fluorine-doped silicate glass (FSG), a low-k dielectric material, and/or other suitable insulating materials.

The cross-sectional shapes of semiconductor device 100 and its elements (e.g., fin structure $108_1$-$108_2$, gate structures 112N1-112N3 and 112P1-112P3, epitaxial fin regions 110A-110B, inner spacers 142, gate spacers 114, and/or STI regions 138) are illustrative and are not intended to be limiting.

Figure 2:
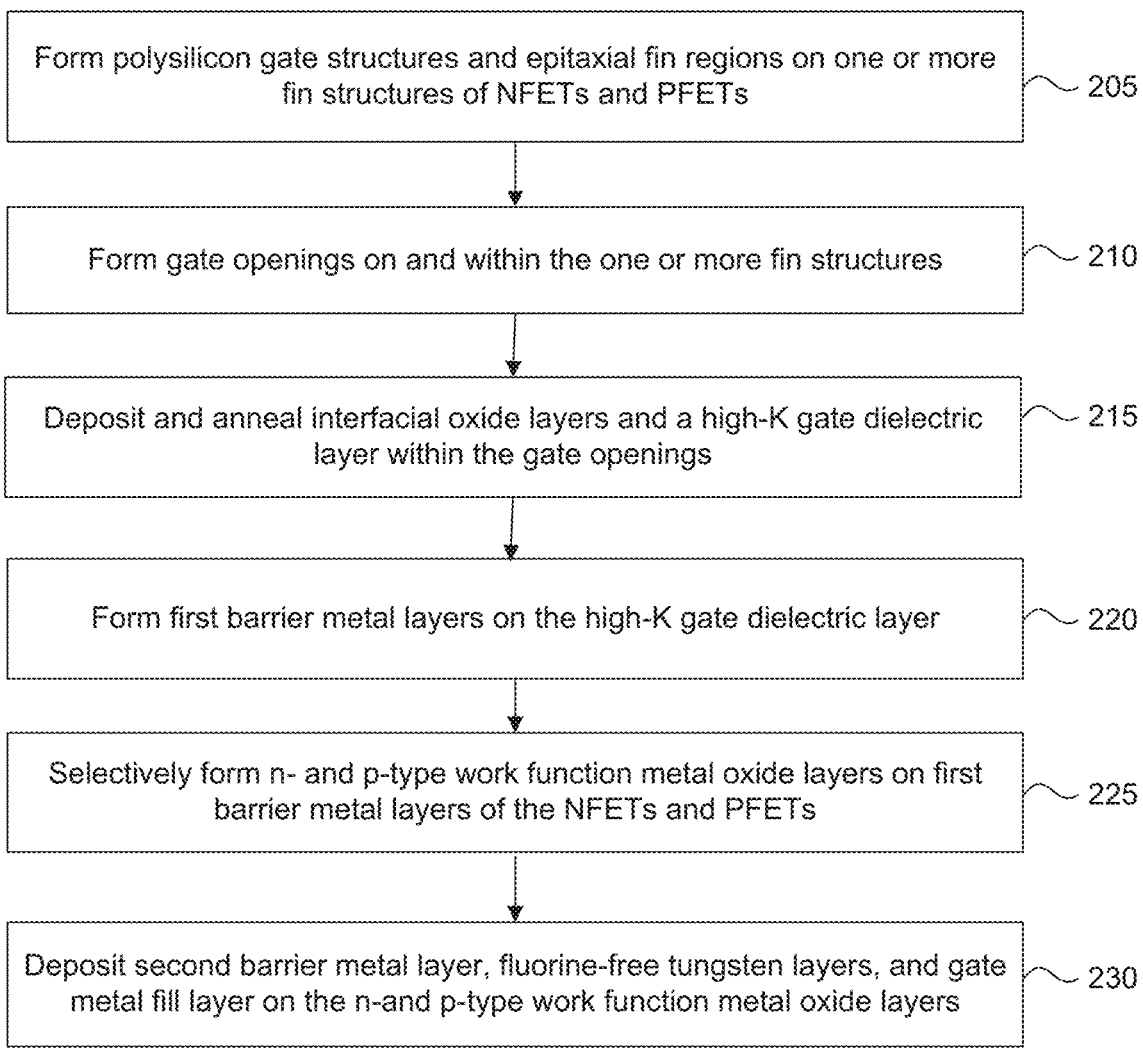
FIG. 2 is a flow diagram of a method for fabricating a semiconductor device with different gate structures, in accordance with some embodiments.

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-14B. FIGS. 3A-14B are cross-sectional views along lines A-A and B-B of semiconductor device 100 at various stages of fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-14B with the same annotations as elements in FIGS. 1A-1O are described above.

In operation 205, polysilicon structures and epitaxial fin regions are formed on fin structures of NFETs and PFETs. For example, as shown in FIGS. 3A-3B, polysilicon structures 312 can be formed on fin structures $108_1$-$108_2$ and gate spacers 114 can be formed on sidewalls of polysilicon structures 312. During subsequent processing, polysilicon structures 312 can be replaced in a gate replacement process to form gate structures 112N1-112N3 and 112P1-112P3. Following the formation of gate spacers 114, n- and p-type epitaxial fin regions 110A-110B can be selectively formed on portions of fin structures $108_1$-$108_2$ that are not underlying polysilicon structures 312. After the formation of epitaxial fin regions 110A-110B, ESL 116 and ILD 118 can be formed to form the structures of FIGS. 3A-3B.

Figure 4B:
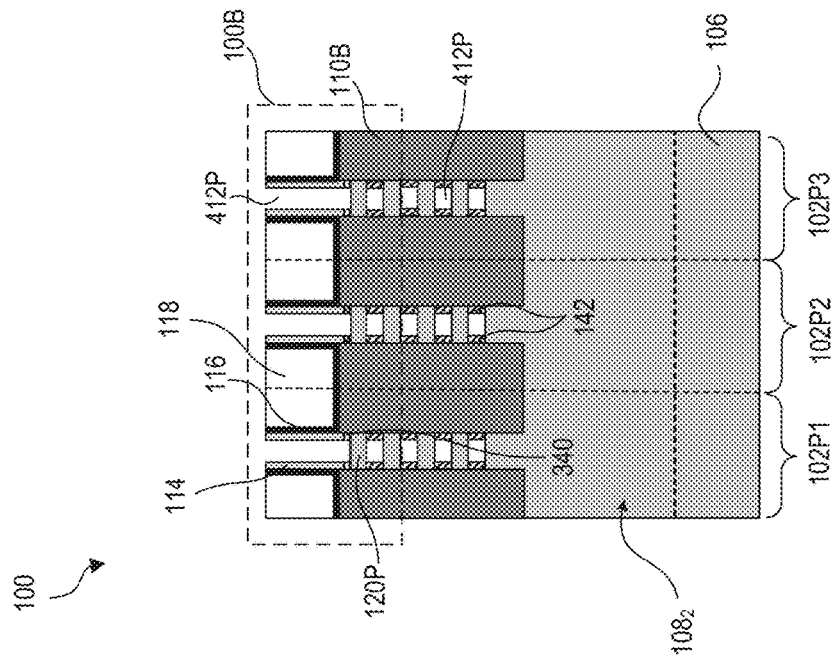
Figure 4A:
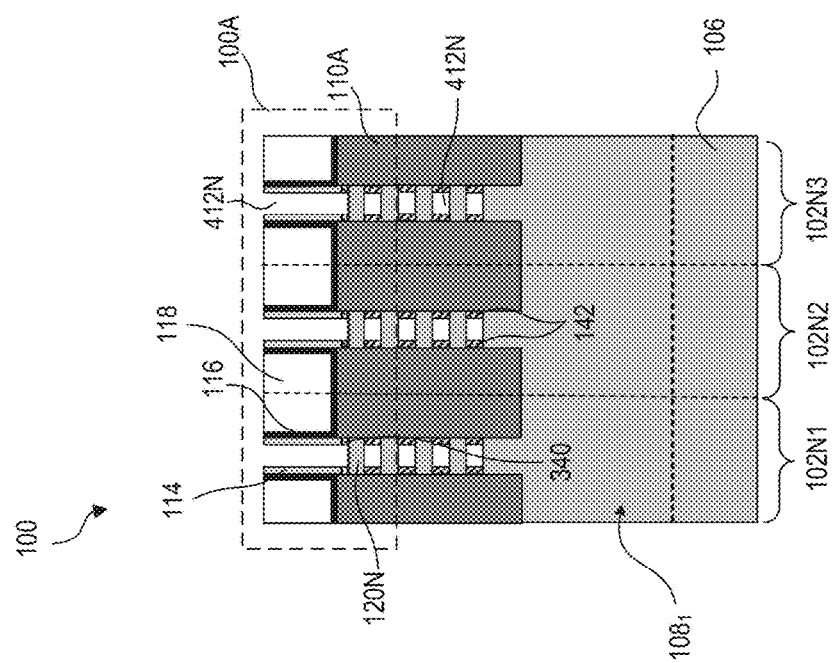
Figure 6A:
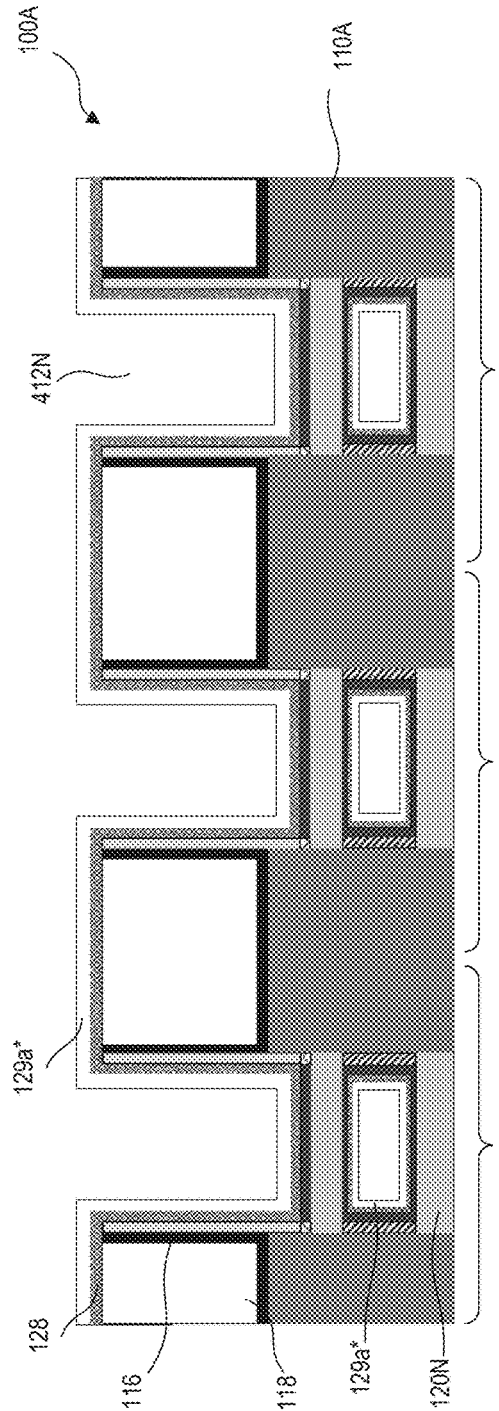
Figure 6B:
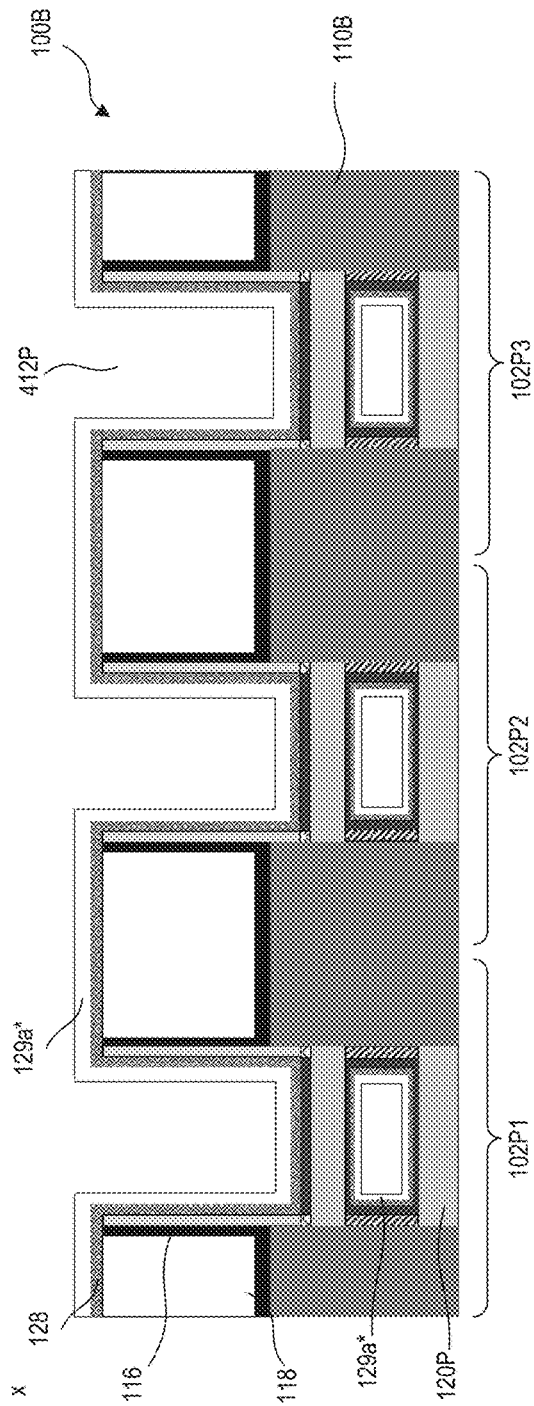

Referring to FIG. 2, in operation 210, gate openings are formed on and within the one or more fin structures. For example, as shown in FIGS. 4A-4B, gate openings 412N-412P associated with NFETs 102N1-102N3 and PFETs 102P1-102P3, respectively, can be formed on and within fin structures $108_1$-$108_2$. The formation of gate openings 412N can include sequential operations of (i) etching polysilicon structures 312 from the structures of FIGS. 3A-3B, and (ii) etching nanostructured regions 122N-122P from the structures of FIGS. 3A-3B. In some embodiments, the etching of nanostructured regions 122N-122P can include using a dry etching process or a wet etching process with higher selectivity towards the material (e.g., SiGe) of nanostructured regions 122N-122P than the material (e.g., Si) of nanostructured channel regions 120N-120P. In some embodiments, the wet etching process can include using a mixture of sulfuric acid ($H_2SO_4$) and hydrogen peroxide ($H_2O_2$) (SPM) and/or a mixture of ammonia hydroxide ($NH_4OH$) with $H_2O_2$ and deionized (DI) water (APM). In some embodiments, the wet etching process can include using a mixture ($NH_4OH$) with HCl.

Referring to FIG. 2, in operations 215-230, gate-all-around (GAA) structures are formed in the gate openings. For example, based on operations 215-230, gate structures 112N1-112N3 and 112P1-112P3 can be wrapped around nanostructured channel regions 120N-120P, as described with reference to FIGS. 5A-14B.

In operation 215, interfacial oxide layers and an HK gate dielectric layer are deposited and annealed within the gate openings. For example, as shown in FIGS. 5A-5B, interfacial oxide layers 127 and a gate dielectric layer 128 can be deposited and annealed on nanostructured channel regions 120N-120P within gate openings 412N-412P (shown in FIGS. 4A-4B). During subsequent processing, HK gate dielectric layer 128 can form HK gate dielectric layers 128N1-128N3 and 128P1-138P3, as shown in FIGS. 1A-1E. FIGS. 5A-5B show portions 100A-100B of the structures of FIGS. 4A-4B, respectively, for the sake of clarity.

Interfacial oxide layers 127 can be formed on exposed surfaces of nanostructured channel regions 120N-120P within gate openings 412N-412P, respectively. In some embodiments, interfacial oxide layers 127 can be formed by exposing nanostructured channel regions 120N-120P to an oxidizing ambient. For example, the oxidizing ambient can include a combination of ozone (03), a mixture of ammonia hydroxide, hydrogen peroxide, and water (SC1 solution), and/or a mixture of hydrochloric acid, hydrogen peroxide, water (SC2 solution). As a result of the oxidation process, oxide layers ranging from about 0.5 nm to about 1.5 nm can be formed on the exposed surfaces of nanostructured channel regions 120N-120P.

The deposition of HK gate dielectric layer 128 can include blanket depositing HK gate dielectric layer 128 on the partial semiconductor device 100 (not shown) formed after the formation of interfacial oxide layers 127. The blanket deposited HK gate dielectric layer 128 can be substantially conformally deposited on interfacial oxide layers 127 and the exposed surfaces of the partial semiconductor device 100 (e.g., sidewalls of gate openings 412N-412P and top surfaces of ILD 118), as shown in FIGS. 5A-5B. In some embodiments, HK gate dielectric layer 128 can include a dielectric material with a dielectric constant (k-value) higher than about 3.9. In some embodiments, HK gate dielectric layer 128 can include (i) a high-k dielectric material, such as hafnium oxide ($HfO_2$), $TiO_2$, HfZrO, $Ta_2O_3$, $HfSiO_4$, $ZrO_2$, and $ZrSiO_2$, (ii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iii) a combination thereof. In some embodiments, HK gate dielectric layer 128 can be formed with ALD using hafnium chloride ($HfCl_4$) as a precursor at a temperature ranging from about 250° C. to about 350° C. In some embodiments, gate dielectric layer 128 can have a thickness ranging from about 1 nm to about 3 nm in order to wrap around nanostructures channel regions 120N-120P without being constrained by spacing between adjacent nanostructured channel regions 120N and between adjacent nanostructured channel regions 120P.

Referring to FIG. 2, in operation 220, first barrier metal layers are formed on the HK gate dielectric layer. For example, FIGS. 6A-10B illustrate the formation of first barrier metal layers 129a-129c in one embodiment and FIGS. 11A-11B illustrates the formation of first barrier metal layers 129a-129c in another embodiment. During subsequent processing, first barrier metal layers 129a-129c can form first barrier metal layers 129N1-129N3 and 129P1-129P3.

Referring to FIGS. 6A-10B, the formation of first barrier metal layers 129a-129c can include sequential operations of (i) blanket depositing a metal nitride layer 129a* (FIGS. 6A-6B) on the structures of FIGS. 5A-5B, (ii) patterning metal nitride layer 129a* to selectively form first barrier metal layers 129a on NFET 102N3 and PFET 102P3 as shown in FIGS. 7A-7B, (iii) blanket depositing a metal nitride layer 129b* (FIGS. 8A-8B) on the structures of FIGS. 7A-7B, (iv) patterning metal nitride layer 129b* to selectively form first barrier metal layers 129b on NFETs 102N2-102N3 and PFETs 102P2-102P3 as shown in FIGS. 9A-9B, and (v) blanket depositing a metal nitride layer for first barrier metal layer 129c (FIGS. 10A-10B) on the structures of FIGS. 9A-9B.

Operations (i)-(v) can be repeated to form additional first barrier metal layers similar to first barrier metal layers 129a-129c in NFETs 102N1-102N3 and PFETs 102P1-102P3. In subsequent processing, (i) the portions of first barrier metal layer 129c within gate openings 412N-412P of NFET 102N1 and PFET 102P1 can form first barrier metal layers 129N1 and 129P1, respectively, (ii) the portions of first barrier metal layers 129b-129c within gate openings 412N-412P of NFET 102N2 and PFET 102P2 can form first barrier metal layers 129N2 and 129P2, respectively, and (iii) the portions of first barrier metal layers 129a-129c within gate openings 412N-412P of NFET 102N2 and PFET 102P2 can form first barrier metal layers 129N2 and 129P2, respectively. Thus, the different thicknesses T1-T6 (FIGS. 1B-1C) of first barrier metal layers 129N1-129N3 and 129P1-129P3 can be achieved by selectively forming different number of stacked layers in NFETs 102N1-102N3 and PFETs 102P1-102P3 through multiple deposition and patterning operations.

The blanket deposition of metal nitride layer 129a* can include blanket depositing about 0.1 nm to about 0.5 nm thick metal nitride layer with an ALD or a CVD process using titanium tetrachloride ($TiCl_4$) and $NH_3$ as precursors at a temperature ranging from about 400° C. to about 450° C. and at a pressure ranging from about 2 torr to about 10 torr. In some embodiments, metal nitride layer 129a* can be deposited in an ALD process of about 20 cycles to about 30 cycles, where one cycle can include sequential periods of: (i) first precursor gas (e.g., $TiCl_4$) flow, (ii) a first gas purging process, (iii) a second precursor gas (e.g., $NH_3$) gas flow, and (iv) a second gas purging process. The blanket deposited metal nitride layer 129a* can be substantially conformally deposited (e.g., step coverage of about 99%) on the structures of FIGS. 5A-5B. The blanket deposition of metal nitride layers 129b*-129c* can be similar to the blanket deposition of metal nitride layer 129a*. In some embodiments, the materials of metal nitride layer 129a*129c* can include Ti— or Ta-based nitrides or alloys and can be similar to or different from each other.

The patterning of metal nitride layer 129a*129c* to form first barrier metal layers 129a-129c can include photolithographic and etching processes. The etching process can include a wet etching process using etchants that include a mixture of ammonia hydroxide, hydrogen peroxide, and water (SC1 solution), and/or a mixture of hydrochloric acid, hydrogen peroxide, and water (SC2 solution).

Instead of the different number of stacked layers, the different thicknesses T1-T6 (FIGS. 1B-1C) of first barrier metal layers 129N1-129N3 and 129P1-129P3 can be achieved by selectively forming first barrier metal layers 129a-129c of different thicknesses in NFETs 102N1-102N3 and PFETs 102P1-102P3, as shown in FIGS. 11A-11B. The selective formation of first barrier metal layers 129a-129c can include sequential operations of (i) blanket depositing a metal nitride layer (not shown) of thickness T1 on the structures of FIGS. 5A-5B, (ii) patterning the metal nitride layer of thickness T1 to selectively form first barrier metal layers 129a on NFET 102N1 and PFET 102P1 as shown in FIGS. 11A-11B, (iii) blanket depositing a metal nitride layer (not shown) of thickness T2 on the structures formed after the formation of first barrier metal layers 129a, (iv) patterning the metal nitride layer of thickness T2 to selectively form first barrier metal layers 129b on NFET 102N2 and PFET 102P2 as shown in FIGS. 11A-11B, (v) blanket depositing a metal nitride layer (not shown) of thickness T3 on the structures formed after the formation of first barrier metal layers 129b, and (vi) patterning the metal nitride layer of thickness T3 to selectively form first barrier metal layers 129c on NFET 102N3 and PFET 102P3 as shown in FIGS. 11A-11B. Even though first barrier metal layer 129c is described to be formed after first barrier metal layers 129b, which is described to be formed after first barrier metal layers 129a, first barrier metal layers 129a-129c can be formed in any order.

The blanket deposition and patterning of the metal nitride layers for first barrier metal layers 129a-129c of FIGS. 11A-11B can be similar to the blanket deposition and patterning processes of metal nitride layer 129a*.

Referring to FIG. 2, in operation 225, n- and p-type WFM oxide layers are selectively formed on the first barrier metal layers of NFETs and PFETs. For example, as shown in FIGS. 12A-13B, nWFM oxide layer 132N can be selectively formed on the structure of FIG. 10A and pWFM oxide layer 132P can be selectively formed on the structure of FIG. 10B. Similarly, nWFM oxide layer 132N can be selectively formed on the structure of FIG. 11A and pWFM oxide layer 132P can be selectively formed on the structure of FIG. 11B, which are not shown here. During subsequent processing, nWFM oxide layer 132N can form nWFM oxide layers 132N1-132N3 and pWFM oxide layer 132P can form pWFM oxide layers 132P1-132P3.

Figures 13A, 13B:
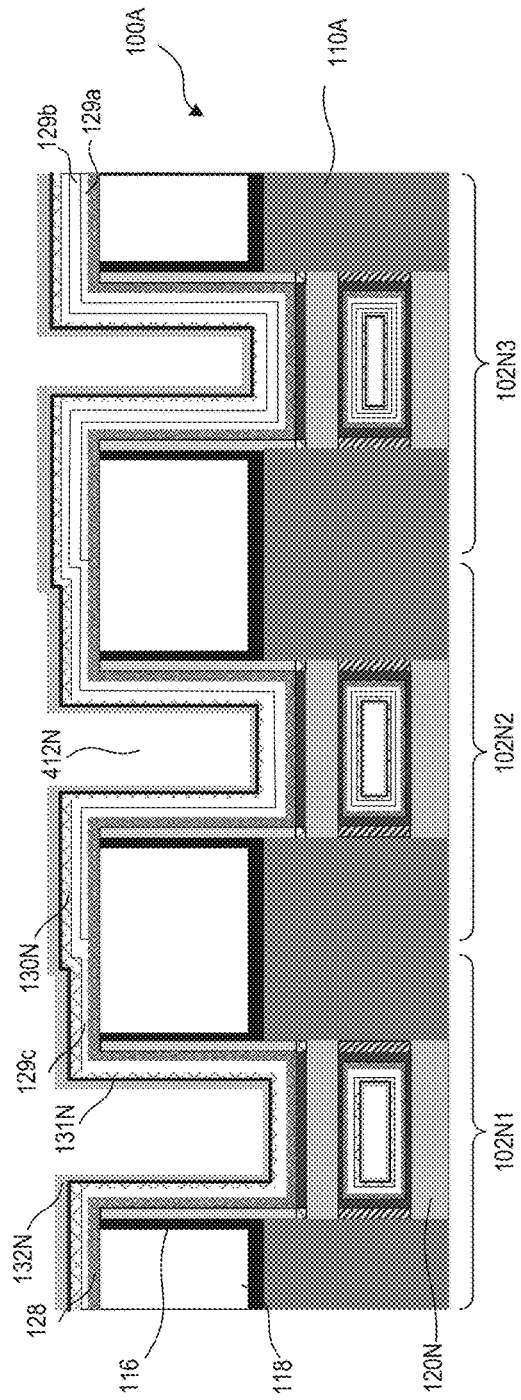

Referring to FIGS. 12A-13B, the selective formation of nWFM oxide layer 132N and pWFM oxide layer 132P can include sequential operations of (i) blanket depositing a metal oxide layer (not shown) for nWFM oxide layer 132N on the structures of FIGS. 10A-10B, (ii) patterning the metal oxide layer to selectively form nWFM oxide layer 132N on NFETs 102N1-102N3 as shown in FIG. 12A, (iii) blanket depositing a metal oxide layer (not shown) for pWFM oxide layer 132P on the structures of FIGS. 12A-12B, and (iv) patterning the metal oxide layer to selectively form pWFM oxide layer 132P on PFETs 102P1-102P3 as shown in FIG. 13B.

In some embodiments, the metal oxide layer for nWFM oxide layer 132N can include (i) REM oxides, such as $La_2O_3$, $CeO_2$, $Yb_2O_3$, $Lu_2O_3$, and $Er_2O_3$; (ii) oxides of a metal from group IIA (e.g., MgO or SrO), group IIIB (e.g., $Y_2O_3$), group IVB (e.g., $HfO_2$ or $ZrO_2$), or group VB (e.g., $Ta_2O_5$) of the periodic table; (iii) $SiO_2$; or (iv) a combination thereof. In some embodiments, the metal oxide layer for pWFM oxide layer 132P can include (i) Al-based metal oxides, such as $Al_2O_3$ and $Al_2TiO_5$; (ii) oxides of a metal from group VB (e.g., NbO), group IIIA (e.g., $B_2O_3$), group VA (e.g., $P_2O_5$) of the periodic table; or (iii) a combination thereof.

The blanket deposition of the metal oxide layer for nWFM oxide layer 132N can include blanket depositing about 0.01 nm to about 2 nm thick metal oxide layer with an ALD or a CVD process using lanthanum tris(formamidinate) $(La(FAMD)_3)$ or lanthanum tetramethylheptanedionate $(La(thd)_3)$ and $O_3$ as precursors at a temperature ranging from about 250° C. to about 350° C. In some embodiments, the metal oxide layer for nWFM oxide layer 132N can be deposited in an ALD process of about 20 cycles to about 30 cycles, where one cycle can include sequential periods of: (i) first precursor gas (e.g., $La(FAMD)_3$ or $La(thd)_3$) flow, (ii) a first gas purging process, (iii) a second precursor gas (e.g., $O_3$) gas flow, and (iv) a second gas purging process. The blanket deposited metal oxide layer can be substantially conformally deposited (e.g., step coverage of about 99%) on the structures of FIGS. 10A-10B.

The patterning of the blanket deposited metal oxide layer for nWFM oxide layer 132N can include (i) selectively forming a masking layer (e.g., a photoresist layer or a nitride layer; not shown) on the portion of the blanket deposited metal oxide on NFETs 102N1-102N3, (ii) selectively removing portions of the blanket deposited metal oxide layer on PFETs 102P1-102P3 to form the structures of FIGS. 12A-12B, and (iii) removing the masking layer. The selectively removing can include an acid-based (e.g., HCl-based) wet or dry etching.

During the blanket deposition of the metal oxide layer for nWFM oxide layer 132N, top surface of first barrier metal layer 129c can be oxidized to form barrier metal oxide layers 130N-130P as shown in FIGS. 12A-12B. Barrier metal oxide layers 130N-130P can have similar thickness. Barrier metal oxide layer 130N can form barrier metal oxide layers 130N1-130N3 in subsequent processing. In some embodiments, barrier metal oxide layer 130P can be etched during the selective removal of the portions of the blanket deposited metal oxide layer on PFETs 102P1-102P3 and in some embodiments, barrier metal oxide layer 130P can remain unetched.

The blanket deposition of the metal oxide layer for pWFM oxide layer 132P can include blanket depositing about 0.01 nm to about 2 nm thick metal oxide layer with an ALD or a CVD process using trimethylaluminium (TMA) and $H_2O$ as precursors at a temperature ranging from about 250° C. to about 350° C. In some embodiments, the metal oxide layer for pWFM oxide layer 132P can be deposited in an ALD process of about 20 cycles to about 30 cycles, where one cycle can include sequential periods of: (i) first precursor gas (e.g., TMA) flow, (ii) a first gas purging process, (iii) a second precursor gas (e.g., $H_2O$) gas flow, and (iv) a second gas purging process. The blanket deposited metal oxide layer can be substantially conformally deposited (e.g., step coverage of about 99%) on the structures of FIGS. 12A-12B.

The patterning of the blanket deposited metal oxide layer for pWFM oxide layer 132P can include (i) selectively forming a masking layer (e.g., a photoresist layer or a nitride layer; not shown) on the portion of the blanket deposited metal oxide on PFETs 102P1-102P3, (ii) selectively removing portions of the blanket deposited metal oxide layer on NFETs 102N1-102N3 to form the structures of FIGS. 13A-13B, and (iii) removing the masking layer. The selectively removing can include an acid-based (e.g., HF-based) wet or dry etching.

During the blanket deposition of the metal oxide layer for pWFM oxide layer 132P, first barrier metal layer 129c on PFETs 102P1-102P3 can be further oxidized to form barrier metal oxide layer 130P* (FIG. 13B), which is thicker than barrier metal oxide layer 130P.

Following the formation of pWFM oxide layer 132P, a drive-in anneal process can be performed on the structures of FIGS. 13A-13B. The drive-in anneal process increases the metal ion (e.g., La ions and/or Al ions) concentration at the interface between nWFM oxide layers 132N and barrier metal oxide layers 130N and at the interface between pWFM oxide layers 132P and barrier metal oxide layers 130P. Increasing the metal ion concentration can increase the dipole concentration in dipole layers 131N-131P (FIGS. 13A-13B) induced by nWFM oxide layer 132N and pWFM oxide layer 132P. The above discussion of dipole layers 131N1-131N3 applies to dipole layer 131N. The above discussion of dipole layers 131P1-131P3 applies to dipole layer 131P.

The drive-in anneal process can include annealing nWFM oxide layers 132N and pWFM oxide layer 132P at a temperature from about 550° C. to about 850° C. and at a pressure from about 1 torr to about 30 torr for a time period ranging from about 0.1 sec to about 30 sec. In some embodiments, the drive-in anneal process can include two anneal processes: (i) a soak anneal process at a temperature from about 550° C. to about 850° C. for a time period ranging from about 2 sec to about 60 sec and (ii) a spike anneal process at a temperature from about 700° C. to about 900° C. for a time period ranging from about 0.1 sec to about 2 sec.

Figure 14A:
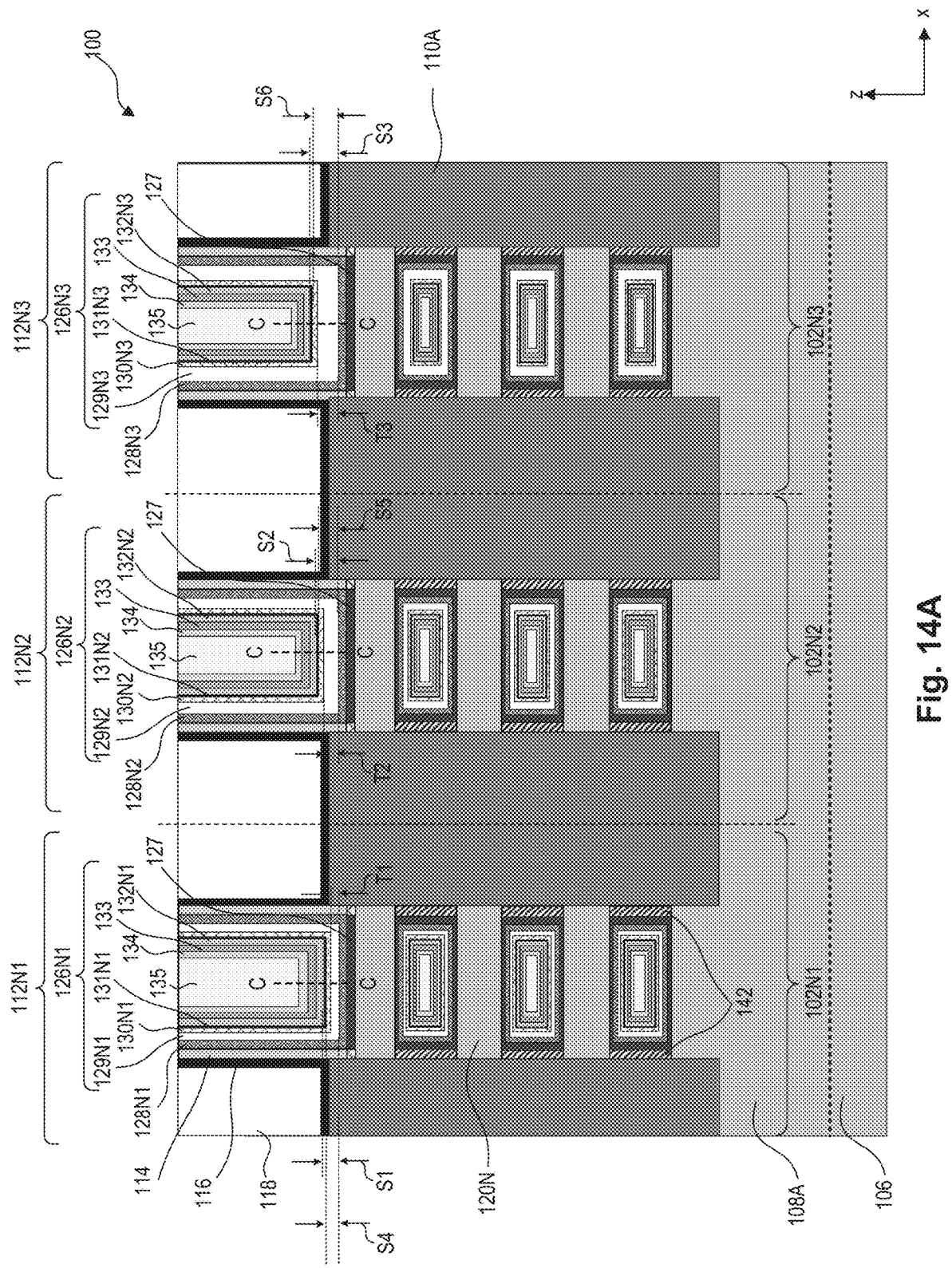
Figure 14B:
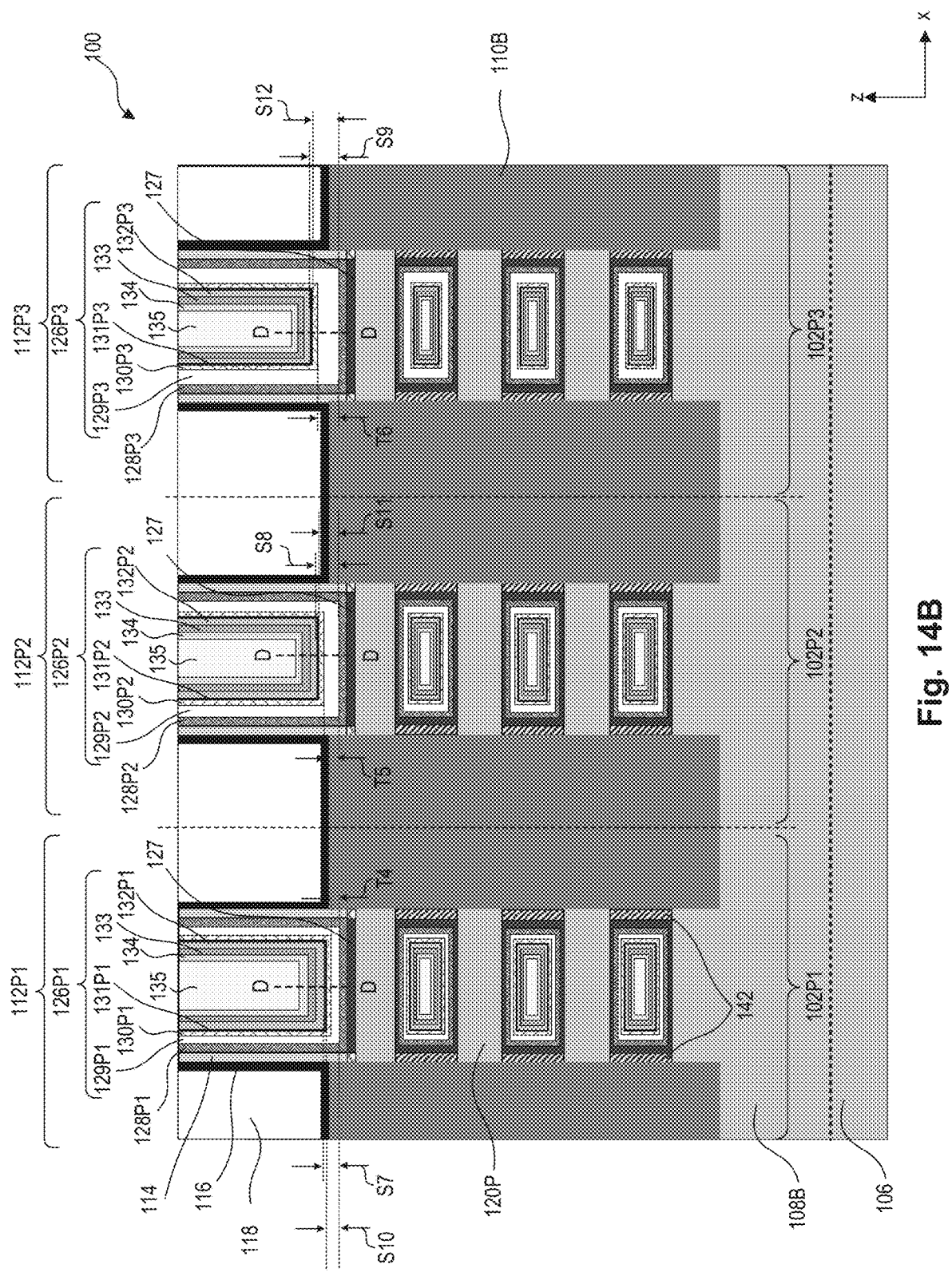

Referring to FIG. 2, in operation 230, second barrier metal layers, FFW layers, and gate metal fill layers are formed on the n- and p-type WFM oxide layers. For example, as shown in FIGS. 14A-14B, second barrier metal layers 133, FFW layers 134, and gate metal fill layers 135 can be formed on the structures of FIGS. 13A-13B. The material for second barrier metal layers 133 can be blanket deposited on the structures of FIGS. 13A-13B. The material FFW layers 134 can be blanket deposited on the material for second barrier metal layers 133. The material for gate metal fill layers 135 can be blanket deposited on the material for FFW layers 134. Following these blanket depositions, HK gate dielectric layer 128, first barrier metal layers 129a-129c, barrier metal oxide layers 130N-130P, nWFM oxide layer 132N, pWFM oxide layer 132P, the material for second barrier metal layers 133, the material for FFW layers 134, and the material for gate metal fill layers 135 can be polished by a chemical mechanical polishing process to form the structures of FIGS. 14A-14B. Thus, as described in operations 215-230, gate structures 112N1-112N3 and 112P1-112P3 can be formed with at least three different threshold voltages on the same substrate 106.

The present disclosure provides example FET gate structures with different EWF values to form FETs (e.g., GAA FETs and/or finFETs) with different threshold voltages and provides example methods of forming such FETs on the same substrate. The example methods form NFETs NFETs (e.g., NFETs 102N1-102N3) and PFETs PFETs (e.g, PFETs 102P1-102P3) with different gate structure configurations (e.g., gate structures 112N1-112N3 and 112P1-112P3), but with similar WFM layer thicknesses can be selectively formed on the same substrate (e.g., substrate 106) to achieve threshold voltages (e.g., threshold voltages V1-V6) different from each other. The different gate structure configurations can have barrier metal layers (e.g., barrier metal layers 129N1-129N3 and 129P1-129P3) of different thicknesses disposed between the WFM layers and high-K gate dielectric layers (e.g., HK gate dielectric layers 128N1-128N3 and 128P1-128P3). In addition, the WFM layers can include WFM oxide layers (e.g., WFM oxide layers 132N1-132N3 and 132P1-132P3) that induce dipole layers (e.g., dipole layers 131N1-131N3 and 131P1-131P3) at the interface between the WFM layers and the barrier metal layers. The different barrier metal layer thicknesses (e.g., thicknesses T1-T6) provide different spacings (e.g., spacings S1-S6) between the WFM layers and high-K gate dielectric layers and different spacings (e.g., spacings S7-S12) between the induced dipole layers and the high-K gate dielectric layers. These different spacings result in the FET gate structures having EWF values (e.g., EWF values E1-E6) different from each other and consequently having threshold voltages different from each other. Thus, tuning the barrier metal layer thicknesses can tune the EWF values of the NFET and PFET gate structures and, as a result, adjust the threshold voltages of the NFETs and PFETs without varying their WFM layer thicknesses.

In some embodiments, a semiconductor device includes a substrate, first and second pair of epitaxial source/drain (S/D) regions disposed on the substrate, first and second nanostructured channel regions disposed between the epitaxial S/D regions of the first pair of epitaxial S/D regions and between the epitaxial S/D regions of the second pair of epitaxial S/D regions, respectively, and first and second gate structures with effective work function values different from each other. The first and second gate structures include first and second high-K gate dielectric layers surrounding the first and second nanostructured channel regions, respectively, first and second barrier metal layers with thicknesses different from each other disposed on the first and second high-K gate dielectric layers, respectively, first and second work function metal (WFM) oxide layers with thicknesses substantially equal to each other disposed on the first and second barrier metal layers, respectively, a first dipole layer disposed between the first WFM oxide layer and the first barrier metal layer, and a second dipole layer disposed between the second WFM oxide layer and the second barrier metal layer.

In some embodiments, a semiconductor device includes a substrate, first and second pair of epitaxial source/drain (S/D) regions disposed on the substrate, first and second fin regions disposed between the epitaxial S/D regions of the first pair of epitaxial S/D regions and between the epitaxial S/D regions of the second pair of epitaxial S/D regions, respectively. The semiconductor device further includes first and second gate structures having first and second high-K gate dielectric layers disposed on the first and second fin regions, respectively, first and second barrier metal layers with thicknesses different from each other disposed on the first and second high-K gate dielectric layers, respectively, first and second barrier metal oxide layers disposed on the first and second barrier metal layers, respectively, an aluminum (Al)-free rare-earth metal-based (REM-based) work function metal (WFM) oxide layer disposed on the first barrier metal oxide layer, and an Al-based WFM oxide layer disposed on the second barrier metal oxide layer.

In some embodiments, a method includes forming first and second nanostructured channel regions in a fin structure on a substrate, forming first and second high-K gate dielectric layers surrounding the first and second nanostructured channel regions, respectively, forming first and second barrier metal layers of different thicknesses on the first and second high-K gate dielectric layers, forming first and second work function metal (WFM) oxide layers of substantially equal thicknesses on the first and second barrier metal layers, respectively, performing a drive-in anneal process on the first and second WFM oxide layers, forming third and fourth barrier metal layers of substantially equal thicknesses on the first and second WFM oxide layers, and forming first and second gate metal fill layers on the third and fourth barrier metal layers, respectively.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming first and second fin structures on a substrate;
forming a high-K gate dielectric layer on the first and second fin structures;

forming first and second metal layers of different thicknesses on first and second portions of the high-K gate dielectric layer;

forming first and second metal oxide layers of substantially equal thicknesses on the first and second metal layers, respectively;

forming a first dipole layer between the first metal oxide layer and the first metal layer;

forming a second dipole layer between the second metal oxide layer and the second metal layer; and forming first and second gate metal fill layers on the first and second metal oxide layers, respectively.

2. The method of claim 1, wherein forming the first and second dipole layers comprises performing a drive-in anneal process on the first and second metal oxide layers.

3. The method of claim 1, wherein forming the first and second dipole layers comprises performing first and second drive-in anneal processes at temperatures different from each other on the first and second metal oxide layers.

4. The method of claim 1, wherein forming the first and second dipole layers comprises performing a soak anneal process and a spike anneal process at temperatures different from each other on the first and second metal oxide layers.

5. The method of claim 1, further comprising oxidizing top surfaces of the first and second metal layers to form third and fourth metal oxide layers during the forming of the first metal oxide layer.

6. The method of claim 1, wherein forming the first metal oxide layer comprises forming a rare-earth metal oxide layer.

7. The method of claim 1, wherein forming the second metal oxide layer comprises forming an aluminum-based oxide layer.

8. The method of claim 1, wherein forming the first and second metal layers comprises:

forming a first stack of nitride layers on the first portion of the high-K gate dielectric layer; and forming a second stack of nitride layers on the second portion of the high-K gate dielectric layer, wherein the first stack of nitride layers is thicker than the second stack of nitride layers.

9. The method of claim 1, wherein forming the first and second metal layers comprises:

depositing a first nitride layer comprising first and second layer portions on the first and second portions of the high-K gate dielectric layer, respectively;

etching the first layer portion to expose the first portion of the high-K gate dielectric layer; and depositing a second nitride layer on the first portion of the high-K gate dielectric layer and on the second layer portion.

10. The method of claim 1, wherein forming the first metal oxide layer comprises:

depositing a rare-earth metal oxide layer comprising first and second layer portions on the first and second metal layers, respectively; and etching the second layer portion to expose the second metal layer.

11. The method of claim 1, wherein forming the second metal oxide layer comprises:

depositing an aluminum-based oxide layer comprising first and second layer portions on the first metal oxide layer and on the second metal layer; and etching the first layer portion to expose the first metal oxide layer.

12. A method, comprising:

forming first and second nanostructured channel regions on a substrate;

forming a high-K gate dielectric layer surrounding the first and second nanostructured channel regions;

forming first and second metal layers of different thicknesses on first and second portions of the high-K gate dielectric layer;

forming first and second metal oxide layers of substantially equal thicknesses on the first and second metal layers, respectively;

performing first and second drive-in anneal processes at temperatures different from each other on the first and second metal oxide layers; and forming first and second gate metal fill layers on the first and second metal oxide layers, respectively.

13. The method of claim 12, wherein forming the first metal oxide layer comprises forming a rare-earth metal (REM) oxide layer with an REM concentration profile having a peak REM concentration at an interface between the first metal oxide layer and the first metal layer.

14. The method of claim 12, wherein forming the second metal oxide layer comprises forming an aluminum (Al)-based oxide layer with an Al concentration profile having a peak Al concentration at an interface between the second metal oxide layer and the second metal layer.

15. The method of claim 12, further comprising depositing third and fourth metal layers on the first and second metal oxide layers.

16. The method of claim 12, wherein forming the first and second metal layers comprises:

forming a first nitride layer with a first thickness on the first portion of the high-K gate dielectric layer; and forming a second nitride layer with a second thickness on the second portion of the high-K gate dielectric layer, wherein the first and second thicknesses are different from each other.

17. A semiconductor device, comprising:

a substrate;

first and second fin structures disposed on the substrate; and first and second gate structures disposed on the first and second fin structures, respectively, comprising:

first and second metal layers with thicknesses different from each other disposed on the first and second high-K gate dielectric layers, respectively;

first and second metal oxide layers with thicknesses substantially equal to each other disposed on the first and second metal layers, respectively;

a first dipole layer disposed between the first metal oxide layer and the first metal layer; and a second dipole layer disposed between the second metal oxide layer and the second metal layer.

18. The semiconductor device of claim 17, wherein the first and second gate structures further comprise third and fourth metal oxide layers disposed on the first and second metal layers, respectively; and wherein the third and fourth barrier metal oxide layers comprise an oxide of a metal in the first and second metal layers, respectively.

19. The semiconductor device of claim 17, wherein the first and second dipole layers comprise metal ions of rare-earth metals or of metals from group IIA, IIIB, or IVB of the periodic table.

20. The semiconductor device of claim 17, wherein the first and second dipole layers comprise metal ions of aluminum-based metals or of metals from group IIIA, VA, or VB of the periodic table.

* * * * *

UNITED STATES PATENT AND TRADEMARK OFFICE
CERTIFICATE OF CORRECTION

PATENT NO. : 12,057,478 B2
APPLICATION NO. : 17/837859
DATED : August 6, 2024
INVENTOR(S) : Chen et al.

Page 1 of 1

It is certified that error appears in the above-identified patent and that said Letters Patent is hereby corrected as shown below:

In the Specification

In Column 11, Line 5, delete "(03)," and insert -- ($O_3$), --, therefor.

In the Claims

In Column 18, Claim 17, Line 43, after "on", delete "the".

In Column 18, Claim 19, Line 61, delete "the" and insert -- a --, therefor.

In Column 18, Claim 20, Line 66, delete "the" and insert -- a --, therefor.

Signed and Sealed this
First Day of October, 2024

*Katherine Kelly Vidal*

Katherine Kelly Vidal
*Director of the United States Patent and Trademark Office*